United States Patent
Hsu et al.

(10) Patent No.: US 12,224,285 B2
(45) Date of Patent: Feb. 11, 2025

(54) INTEGRATED CIRCUIT AND METHOD OF FORMING THE SAME

(71) Applicant: TAIWAN SEMICONDUCTOR MANUFACTURING COMPANY, LTD., Hsinchu (TW)

(72) Inventors: Chin-Wei Hsu, Hsinchu (TW); Shun Li Chen, Hsinchu (TW); Ting Yu Chen, Hsinchu (TW); Hui-Zhong Zhuang, Hsinchu (TW); Chih-Liang Chen, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 332 days.

(21) Appl. No.: 17/828,981

(22) Filed: May 31, 2022

(65) Prior Publication Data

US 2023/0387128 A1 Nov. 30, 2023

(51) Int. Cl.
*H01L 27/118* (2006.01)

(52) U.S. Cl.
CPC ............ *H01L 27/11807* (2013.01); *H01L 2027/11875* (2013.01); *H01L 2027/11881* (2013.01)

(58) Field of Classification Search
CPC ..... H01L 27/11807; H01L 2027/11875; H01L 2027/11881; H01L 27/0207
See application file for complete search history.

(56) References Cited

U.S. PATENT DOCUMENTS

| | | | |
|---|---|---|---|
| 2019/0198508 A1* | 6/2019 | Sharma | G11C 11/417 |
| 2020/0350250 A1 | 11/2020 | Wang et al. | |
| 2021/0134837 A1* | 5/2021 | You | H01L 27/11807 |
| 2021/0279397 A1 | 9/2021 | Wang et al. | |
| 2021/0343744 A1 | 11/2021 | Chiu et al. | |

FOREIGN PATENT DOCUMENTS

| | | |
|---|---|---|
| TW | 202009599 | 3/2020 |
| TW | 202141639 | 11/2021 |
| TW | 202217637 | 5/2022 |

* cited by examiner

*Primary Examiner* — Mohammed R Alam
(74) *Attorney, Agent, or Firm* — Hauptman Ham, LLP

(57) ABSTRACT

An integrated circuit includes a set of active regions, a first contact, a set of gates, a first and second conductive line and a first and second via. The set of active regions extends in a first direction, and is on a first level. The first contact extends in a second direction, is on a second level, and overlaps at least a first active region. The set of gates extends in the second direction, overlaps the set of active regions, and is on a third level. The first conductive line and the second conductive line extend in the first direction, overlap the first contact, and are on a fourth level. The first via electrically couples the first contact and the first conductive line together. The second via electrically couples the first contact and the second conductive line together.

20 Claims, 21 Drawing Sheets

INTEGRATED CIRCUIT AND METHOD OF FORMING THE SAME

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
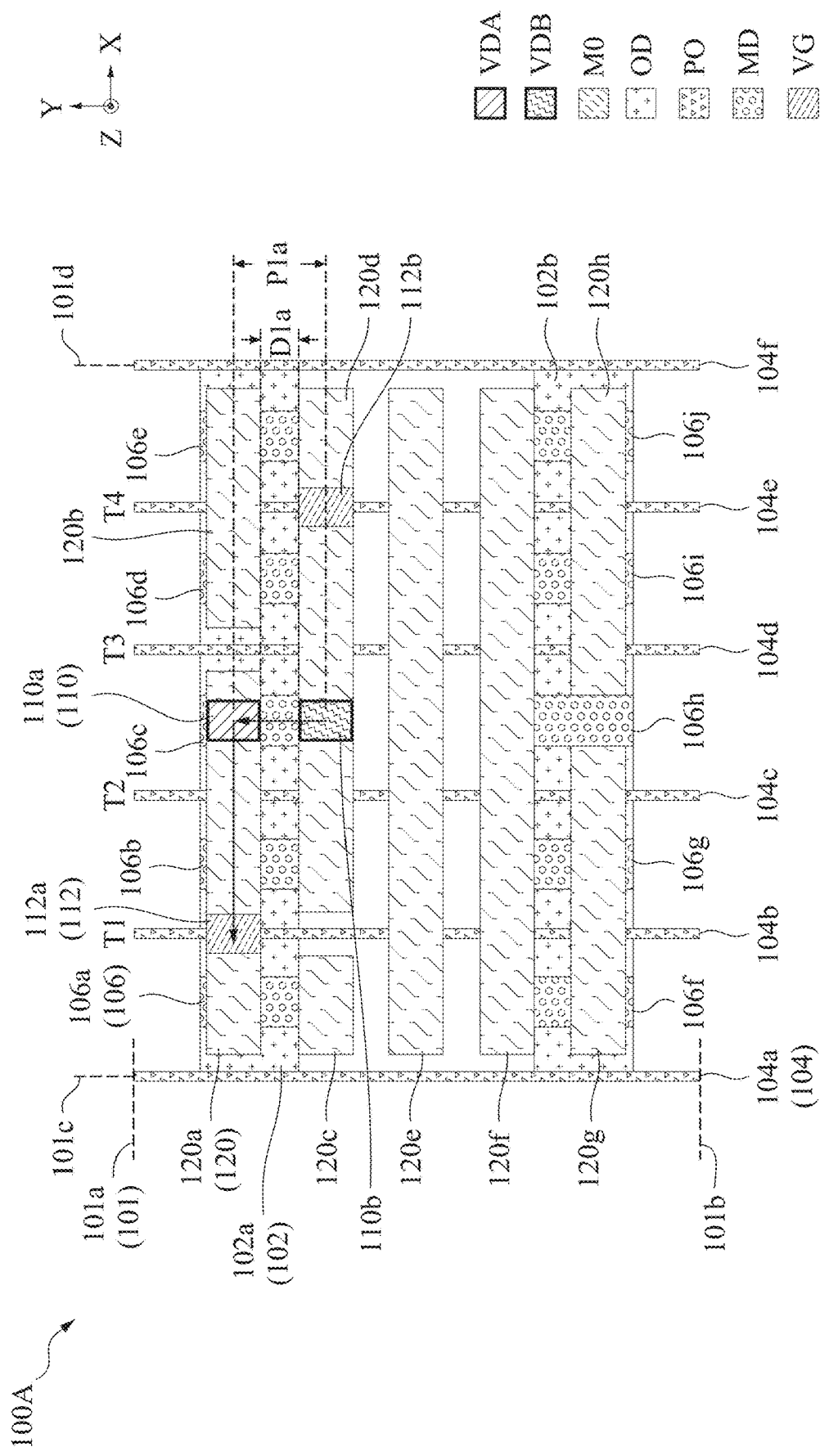
FIGS. 1A-1B are diagrams of a layout design of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a set of active regions, a first contact, a set of gates, a first conductive line, a second conductive line, a first via and a second via.

In some embodiments, the set of active regions extends in a first direction, and is on a first level of a substrate.

In some embodiments, the first contact extends in a second direction different from the first direction, and overlaps at least a first active region of the set of active regions. In some embodiments, the first contact is on a second level different from the first level.

In some embodiments, the set of gates extends in the second direction, overlaps the set of active regions, and is on a third level different from the first level.

In some embodiments, the first conductive line extends in the first direction, and overlaps the first contact, and is on a fourth level different from the first level, the second level and the third level.

In some embodiments, the second conductive line extends in the first direction, is on the fourth level, and overlaps the first contact. In some embodiments, the second conductive line is separated from the first conductive line in the second direction. In some embodiments, the second conductive line and the first conductive line are separated from each other by one metal routing track.

In some embodiments, the first via is between the first contact and the first conductive line. In some embodiments, the first via electrically couples the first contact and the first conductive line together.

In some embodiments, the second via is between the first contact and the second conductive line. In some embodiments, the second via electrically couples the first contact and the second conductive line together. In some embodiments, the second via and the first via are separated from each other by one metal routing track.

In some embodiments, by the first via and the second via overlapping the first contact, and by the first via and the second via being separated from each other in the second direction by one metal routing track, the first conductor and the second conductor are located in adjacent routing tracks and are electrically connected together by not utilizing other metal routing tracks in the second direction or in other metal layers, thereby saving routing resources compared to other approaches. In some embodiments, by the integrated circuit saving routing resources results in the integrated circuit having at least smaller area, more routing flexibility, reduced power or improved performance compared to other approaches.

Figure 1B:
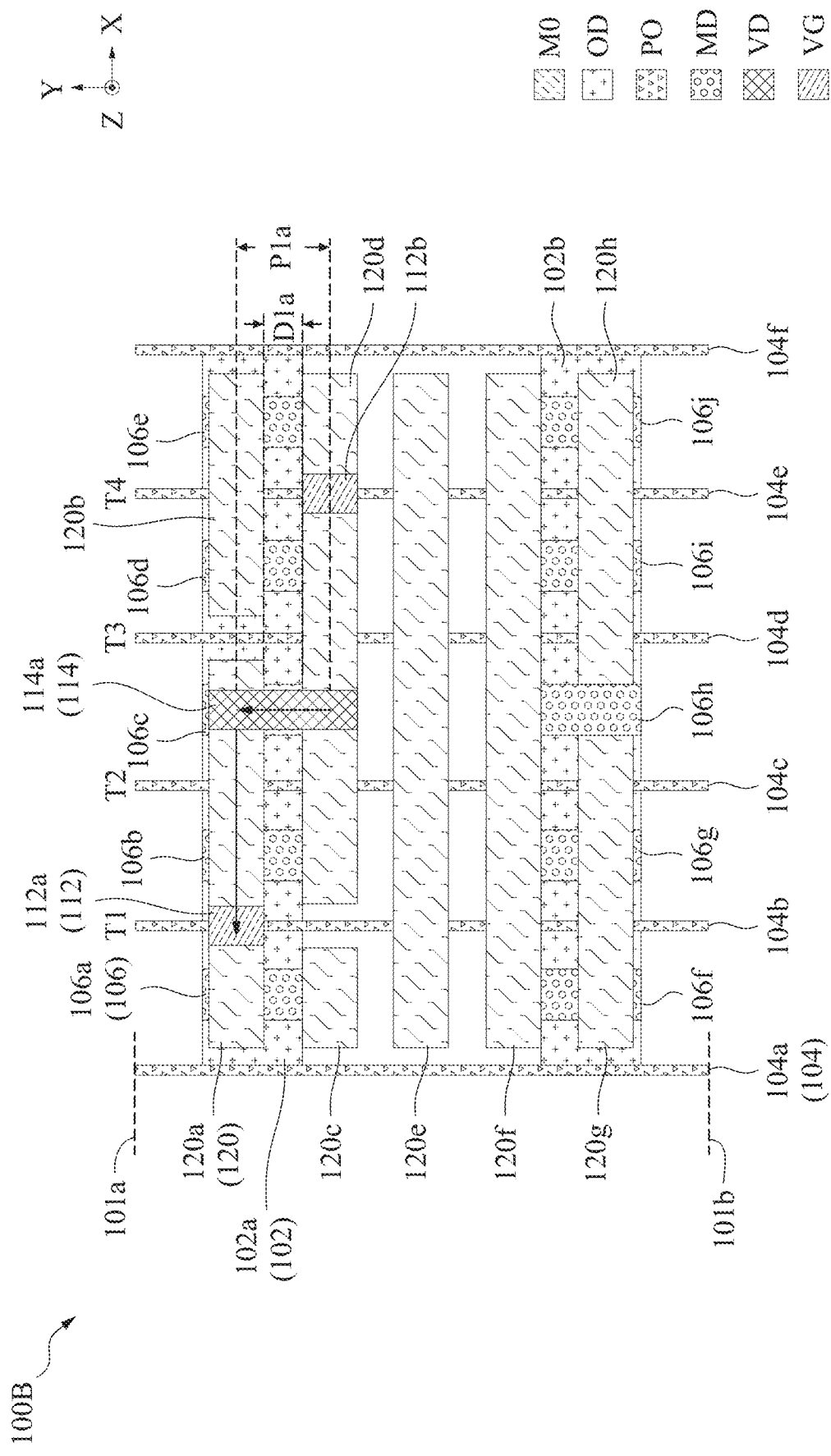

FIGS. 1A-1B are diagrams of a corresponding layout design 100A-100B of a corresponding integrated circuit, in accordance with some embodiments. Layout design 100A is a layout diagram of an integrated circuit 200A of FIG. 2A. Layout design 100B is a layout diagram of an integrated circuit 200B of FIG. 2B.

For ease of illustration, some of the labeled elements of one or more of FIGS. 1A-1B, 2A-2D and 3A-7C are not labelled in one or more of FIGS. 1A-1B, 2A-2D and 3A-7C. In some embodiments, layout design 100A includes additional elements not shown in FIG. 1A.

Layout design 100A includes one or more features of an oxide diffusion (OD) level or an active level, a gate (POLY) level, a metal over diffusion (MD) level, a via over gate (VG) level, a via over diffusion (VD) level and a metal 0 (M0) level.

Figure 2A:
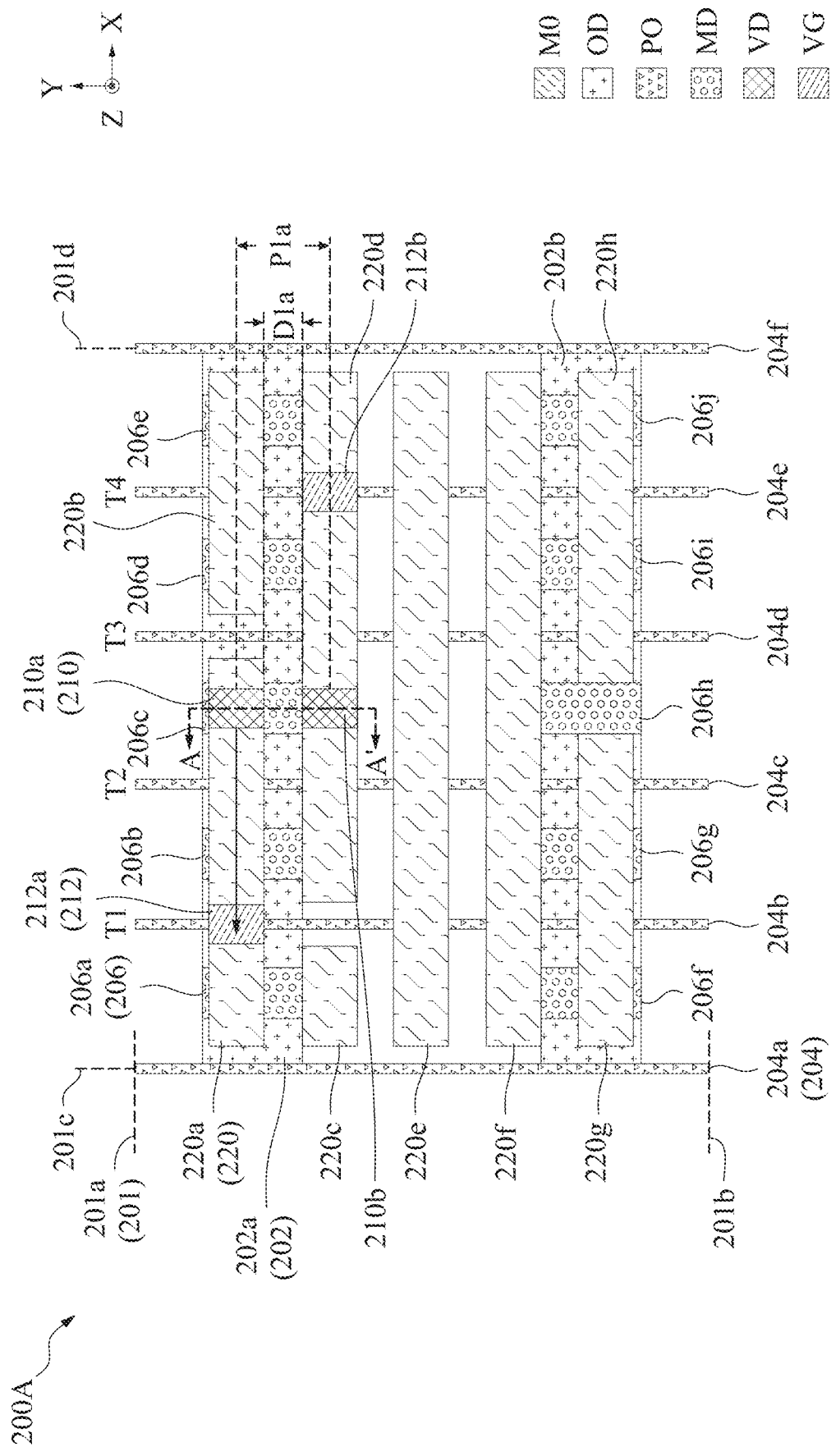
FIGS. 2A-2D are diagrams of an integrated circuit, in accordance with some embodiments.

Layout design 100A is usable to manufacture integrated circuit 200A of FIG. 2A.

Layout design 100A includes a cell 101. The cell 101 has cell boundaries 101a and 101b that extend in a first direction X, and cell boundaries 101c and 101d that extend in a second direction Y. In some embodiments, the second direction Y is different from the first direction X, and a third direction Z is different from the first direction X and the second direction Y. In some embodiments, layout design 100A abuts other cell layout designs (not shown) along cell boundaries 101c and 101d. In some embodiments, layout design 100A abuts other cell layout designs (not shown) along cell boundaries 101a and 101b that extend in the first direction X. In some embodiments, layout design 100A is a single height standard cell.

In some embodiments, cell 101 is a standard cell, and layout design 100A corresponds to a layout of a standard cell defined by cell boundaries 101a, 101b, 101c and 101d. In some embodiments, a cell 101 is a predefined portion of layout design 100A including one or more transistors and electrical connections configured to perform one or more circuit functions. In some embodiments, cell 101 is bounded by cell boundaries 101a, 101b, 101c and 101d, and thus corresponds to a region of functional circuit components or devices that are part of a standard cell.

In some embodiments, e.g., the embodiments depicted in FIGS. 1A-7C discussed below, a given cell has cell boundaries 101c and 101d/201c and 201d that are overlapped by corresponding one gate layout patterns 104a and 104f/ structures 204a and 204f. For example, in some embodiments, cell boundaries 101c and 101d of cell 101 are identified by gate layout patterns 104a and 104f.

A cell is thereby configured as one or more of a standard cell, a custom cell, an engineering change order (ECO) cell, a logic gate cell, a memory cell, a physical device cell, or another type of cell or combination of cells capable of being defined in an IC layout diagram, e.g., IC layout design 100A. In some embodiments, cell 101 is a standard cell of a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells. In some embodiments, one or more of layout design 100A or 100B is a layout design of a memory cell. In some embodiments, a memory cell includes a static random access memory (SRAM), a dynamic RAM (DRAM), a resistive RAM (RRAM), a magnetoresistive RAM (MRAM) or read only memory (ROM). In some embodiments, one or more of layout design 100A or 100B includes layout designs of one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like, FinFETs, nanosheet transistors, nanowire transistors, complementary FETs (CFETs) and planar MOS transistors with raised source/drain. Examples of passive elements include, but are not limited to, capacitors, inductors, fuses, and resistors. In some embodiments, at least layout design 100A or 100B is a standard cell layout design. In some embodiments, one or more of layout design 100A or 100B is a layout design of a logic gate cell.

Layout design 100A further includes one or more active region layout patterns 102a or 102b (collectively referred to as a "set of active region patterns 102") extending in the first direction X.

Embodiments of the present disclosure use the term "layout pattern" which is hereinafter also referred to as "patterns" in the remainder of the present disclosure for brevity.

Active region patterns 102a, 102b of the set of active region patterns 102 are separated from one another in the second direction Y. The set of active region patterns 102 is usable to manufacture a corresponding set of active regions 202 of integrated circuits 200A-200B or 300A-700C (not shown in FIGS. 3A-7C for ease of illustration).

In some embodiments, the set of active regions 202 are located on a front-side (not labelled) of at least integrated circuit 200A-200B or 300A-700C. In some embodiments, active region patterns 102a, 102b of the set of active region patterns 102 are usable to manufacture corresponding active regions 202a, 202b of the set of active regions 202 of integrated circuit 200A-200B or 300A-700C.

In some embodiments, the set of active region patterns 102 is referred to as an oxide diffusion (OD) region which defines the source or drain diffusion regions of at least integrated circuit 200A-200B or 300A-700C or layout design 100A, 100B.

In some embodiments, active region pattern 102a of the set of active region patterns 102 is usable to manufacture source and drain regions of n-type metal oxide semiconductor (NMOS) transistors of integrated circuits 200A-200B and 300A-700C, and active region pattern 102b of the set of active region patterns 102 is usable to manufacture source and drain regions of p-type metal oxide semiconductor (PMOS) transistors of integrated circuits 200A-200B and 300A-700C.

In some embodiments, active region pattern 102a of the set of active region patterns 102 is usable to manufacture source and drain regions of PMOS transistors of integrated circuits 200A-200B and 300A-700C, and active region pattern 102b of the set of active region patterns 102 is usable to manufacture source and drain regions of NMOS transistors of integrated circuits 200A-200B and 300A-700C.

In some embodiments, the set of active region patterns 102 is located on a first layout level. In some embodiments, the first layout level corresponds to an active level or an OD level of one or more of layout designs 100A-100B or integrated circuits 200A-200B and 300A-700C.

In some embodiments, active region pattern 102a is usable to manufacture source and drain regions of one or more n-type finFET transistors, n-type nanosheet transistors or n-type nanowire transistors, and active region layout pattern 102b is usable to manufacture source and drain regions of one or more p-type finFET transistors, p-type nanosheet transistors or p-type nanowire transistors.

In some embodiments, active region pattern 102a is usable to manufacture source and drain regions of one or more p-type finFET transistors, p-type nanosheet transistors or p-type nanowire transistors, and active region layout pattern 102b is usable to manufacture source and drain regions of one or more n-type finFET transistors, n-type nanosheet transistors or n-type nanowire transistors.

Other numbers of active region patterns in the set of active region patterns 102 are within the scope of the present disclosure.

Other configurations, arrangements on other layout levels or quantities of patterns in the set of active region patterns 102 are within the scope of the present disclosure.

Layout design 100A further includes one or more gate patterns 104a, . . . , 104e or 104f (collectively referred to as a "set of gate patterns 104") extending in the second direction Y. Each of the gate patterns of the set of gate patterns 104 is separated from an adjacent gate pattern of the set of gate patterns 104 in the first direction X by a first pitch (not labelled).

The set of gate patterns 104 is usable to manufacture a corresponding set of gates 204 of integrated circuit 200A-200B or 300A-700C.

In some embodiments, gate patterns 104a, . . . , 104e or 104f of the set of gate patterns 104 is usable to manufacture corresponding gates 204a, . . . , 204e or 204f of the set of gates 204 of integrated circuit 200A-200B or 300A-700C.

In some embodiments, at least a portion of gate pattern 104a, . . . , 104e or 104f of the set of gate patterns 104 is usable to manufacture gates of NMOS transistors of integrated circuit 200A-200B or 300A-700C, and at least a portion of gate pattern 104a, . . . , 104e or 104f of the set of gate patterns 104 is usable to manufacture gates of PMOS transistors of integrated circuit 200A-200B or 300A-700C.

The set of gate patterns 104 is above the set of active region patterns 102. The set of gate patterns 104 is positioned on a second layout level different from the first layout level. In some embodiments, the second layout level is different from the first layout level. In some embodiments, the second layout level corresponds to the POLY level of one or more of layout designs 100A-100B or integrated circuits 200A-200B and 300A-700C.

In some embodiments, the POLY level is above the OD level.

Other configurations, arrangements on other layout levels or quantities of patterns in the set of gate patterns 104 are within the scope of the present disclosure.

Layout design 100A further includes one or more contact patterns 106a, . . . , 106i or 106j (collectively referred to as a "set of contact patterns 106") extending in the second direction Y.

Each of the contact patterns of the set of contact patterns 106 is separated from an adjacent contact pattern of the set of contact patterns 106 in at least the first direction X or the second direction Y.

The set of contact patterns 106 is usable to manufacture a corresponding set of contacts 206 of integrated circuit 200A-200B or 300A-700C. In some embodiments, contact pattern 106a, . . . , 106i or 106j of the set of contact patterns 106 is usable to manufacture corresponding contact 206a, . . . , 206i or 206j of the set of contacts 206. In some embodiments, the set of contact patterns 106 is also referred to as a set of metal over diffusion (MD) patterns.

In some embodiments, at least one of contact pattern 106a, . . . , 106i or 106j of the set of contact patterns 106 is usable to manufacture source or drain terminals of one of the NMOS or PMOS transistors of integrated circuit 200A-200B or 300A-700C.

In some embodiments, the set of contact patterns 106 overlap the set of active region patterns 102. The set of contact patterns is located on a third layout level. In some embodiments, the third layout level corresponds to the contact level or an MD level of one or more of layout design 100A-100B, or integrated circuit 200A-200B or 300A-700C. In some embodiments, the third layout level is the same as the second layout level. In some embodiments, the third layout level is different from the first layout level.

Other configurations, arrangements on other layout levels or quantities of patterns in the set of contact patterns 106 are within the scope of the present disclosure.

Layout design 100A further includes one or more conductive feature patterns 120a, 120b, . . . , 120g or 120h (collectively referred to as a "set of conductive feature patterns 120") extending in at least the first direction X.

Each of conductive feature patterns 120a, 120b, . . . , 120g or 120h of the set of conductive feature patterns 120 are separated from each other in at least the second direction Y.

In some embodiments, while each of conductive feature patterns 120a, 120b, . . . , 120g or 120h is shown as continuous patterns, one or more of conductive feature patterns 120a, 120b, . . . , 120g or 120h is separated to form discontinuous patterns. In some embodiments, conductive feature patterns 120a and 120b are one continuous pattern. In some embodiments, conductive feature patterns 120c and 120d are one continuous pattern. In some embodiments, conductive feature patterns 120g and 120h are one continuous pattern.

The set of conductive feature patterns 120 is usable to manufacture a corresponding set of conductors 220 of integrated circuit 200A-200B or 300A-700C. In some embodiments, conductive feature pattern 120a, 120b, . . . , 120g or 120h is usable to manufacture corresponding conductor 220a, 220b, . . . , 220g or 220h of the set of conductors 220 of integrated circuit 200A-200B or 300A-700C. In some embodiments, the set of conductors 220 are located on the front-side (not labelled) of integrated circuit 200A-200B.

In some embodiments, conductive feature pattern 120a, 120b, . . . , 120g or 120h are referred to as "signal line patterns." In some embodiments, conductors 220a, 220b, . . . , 220g or 220h are referred to as "signal lines."

The set of conductive feature patterns 120 overlap the set of gate patterns 104, the set of active region patterns 102 and the set of contact patterns 106. In some embodiments, the set of conductive feature patterns 120 is on a fourth layout level. In some embodiments, the fourth layout level is different from the first layout level, the second layout level and the third layout level. In some embodiments, the fourth layout level corresponds to the M0 level of one or more of layout design 100A-100B, or integrated circuit 200A-200B or 300A-700C. In some embodiments, the M0 level is above the OD level, the POLY level, the MD level, the VG level and the VD level. In some embodiments, the set of conductive feature patterns 120 are located on other metal layers (e.g., metal-1 (M1), metal-2 (M2), etc.).

Each conductive feature pattern in the set of conductive feature patterns 120 is separated from an adjacent conductive feature pattern in the set of conductive feature patterns 120 in the second direction Y by a pitch P1a. In some embodiments, the pitch P1a is measured from a center of a conductive feature pattern in the set of conductive feature patterns 120 to a center of an adjacent conductive feature pattern in the set of conductive feature patterns 120.

In some embodiments, the set of conductive feature patterns 120 corresponds to 5 M0 routing tracks in layout design 100A-100B. Other numbers of M0 routing tracks are within the scope of the present disclosure.

In some embodiments, layout design 100A-100B further includes power rail patterns similar to power rails 340a-340b of FIGS. 3A-7C, and are now shown in FIGS. 1A-1B for ease of illustration, and similar detailed description is omitted for brevity.

Other configurations, arrangements on other layout levels or quantities of patterns in the set of conductive feature patterns 120 are within the scope of the present disclosure.

Layout design 100A further includes one or more via patterns 110a or 110b (collectively referred to as a "set of via patterns 110").

The set of via patterns 110 is usable to manufacture a corresponding set of vias 210 of integrated circuit 200A-200B or 300A-700C. In some embodiments, via patterns 110a, 110b of the set of via patterns 110 are usable to manufacture corresponding vias 210a, 210b of the set of vias 210 of integrated circuit 200A-200B or 300A-700C.

The set of via patterns 110 is positioned at a via over diffusion (VD) level of one or more of layout design 100A-100B or integrated circuit 200A-200B or 300A-700C. In some embodiments, the VD level is above the MD and the OD level. In some embodiments, the VD level is between the MD level and the M0 level. In some embodiments, the VD level is between the third layout level and the fourth layout level. Other layout levels are within the scope of the present disclosure.

In some embodiments, the set of via patterns 110 is located where the set of contact patterns 106 is overlapped by the set of conductive feature patterns 120. In some embodiments, the set of via patterns 110 is between the set of contact patterns 106 and the set of conductive feature patterns 120. In some embodiments, the size of one or more via patterns in the set of vias patterns 110 can be increased thereby reducing resistance compared to other approaches.

Each via pattern in the set of via patterns 110 is separated from an adjacent via pattern in the set of via patterns 110 in the second direction Y by at least the pitch P1a. For example, via pattern 110a is separated from via pattern 110b in the second direction Y by the pitch P1a. In some embodiments, the pitch P1a is measured from a center of at least a via pattern in the set of via patterns 110 to a center of at least another via pattern in the set of via patterns 110.

In some embodiments, via patterns in the set of via patterns 110 that are positioned below adjacent M0 routing tracks are separated from each other by pitch P1a.

In some embodiments, the pitch P1a is related to a color associated with the set of via patterns 110. As shown in FIG. 1A, in some embodiments, the set of via patterns 110 have a color A or B. The color A or B indicates that via patterns 110 with a same color are to be formed on a same mask of a multiple mask set, and via patterns 110 with a different corresponding color are to be formed on a different mask of the multiple mask set. Two colors A and B are depicted in FIG. 1A as an example. FIG. 1B shows one color as an example. In some embodiments, there are more or less than two colors in layout design 100A-100B.

In some embodiments, the pitch P1a is less than or equal to a first range. In some embodiments, the first range ranges from about 20 nm to about 60 nm. In some embodiments, the pitch P1a is greater than the first range. Other ranges or values for pitch P1a of the set of via patterns 110 are within the scope of the present disclosure.

In some embodiments, if the pitch P1a is less than or equal to the first range, then the set of via patterns 110 have at least color A and B, and are formed by different corresponding masks of a multiple mask set. For example, in some embodiments, if the pitch P1a is less than or equal to the first range, and the set of via patterns 110 have at least color A and B, and are formed by different corresponding masks of a multiple mask set, then the pitch P1a is sufficient to create enough separation between vias in the set of via patterns 110 that are manufactured by different masks thereby increasing the manufacturing yield of the set of vias 210 manufactured by the set of via patterns 110 compared to other approaches.

In some embodiments, if the pitch P1a is less than or equal to the first range, and the set of via patterns 110 have a single color (e.g., color A or B) and are formed by a single mask, then the pitch P1a is not sufficient to create enough separation between vias in the set of via patterns 110 that are manufactured by a single mask, thereby reducing the manufacturing yield of the set of vias 210 manufactured by the set of via patterns 110 compared to other approaches.

In some embodiments, if the pitch P1a is greater than the first range, then the set of via patterns 110 have a single color (e.g., color A or B) and are formed by a single mask. For example, in some embodiments, if the pitch P1a is greater than the first range, and the set of via patterns 110 have a single color (e.g., color A or B) and are formed by a single mask, then the pitch P1a is sufficient to create enough separation between vias in the set of via patterns 110 that are manufactured by a single mask, thereby increasing the manufacturing yield of the set of vias 210 manufactured by the set of via patterns 110 compared to other approaches.

Other configurations, arrangements on other layout levels or quantities of patterns in at least set of via patterns 110 are within the scope of the present disclosure.

Layout design 100A further includes one or more via patterns 112a or 112b (collectively referred to as a "set of via patterns 112").

The set of via patterns 112 is usable to manufacture a corresponding set of vias 212 of integrated circuit 200A-200B or 300A-700C. In some embodiments, via patterns 112a or 112b of the set of via patterns 112 are usable to manufacture corresponding vias 212a or 212b of the set of vias 212 of integrated circuit 200A-200B or 300A-700C.

The set of via patterns 112 is positioned at a via over gate (VG) level of one or more of layout design 100A-100B or integrated circuit 200A-200B or 300A-700C. In some embodiments, the VG level is between the POLY level and the M0 level. In some embodiments, the VG level is between the second layout level and the fourth layout level. Other layout levels are within the scope of the present disclosure.

In some embodiments, the set of via patterns 112 is located where the set of gate patterns 104 is overlapped by the set of conductive feature patterns 120. In some embodiments, the set of via patterns 112 is between the set of gate patterns 104 and the set of conductive feature patterns 120. In some embodiments, the size of one or more via patterns in the set of via patterns 112 can be increased thereby reducing resistance compared to other approaches.

Other configurations, arrangements on other layout levels or quantities of patterns in at least set of via patterns 112 are within the scope of the present disclosure.

In some embodiments, by via patterns 110a and 110b overlapping contact pattern 106c, and by via patterns 110a and 110b being separated from each other in the second direction Y by one metal routing track, conductive feature patterns 120a and 120d in the set of conductive feature patterns 120 can be used to manufacture corresponding conductors 220a and 220d that are located in adjacent routing tracks in the set of conductors 220 that are electrically connected together by not utilizing other metal routing tracks in the second direction Y or in other metal layers, thereby saving routing resources compared to other approaches.

In some embodiments, by layout design 100A-100B saving routing resources results in layout design 100A-100B having at least smaller area, more routing flexibility, reduced power or improved performance compared to other approaches.

In some embodiments, by layout design 100A-100B utilizing the set of conductive feature patterns 120 as metal routing tracks that extend in the first direction X, and not utilizing other metal routing tracks in the second direction Y, layout design 100A-100B can reduce and minimize the space between adjacent metal routing tracks in the second direction Y because the set of conductive feature patterns 120 has a regular pattern that is adaptable to one or more different processes than other approaches.

Other configurations, arrangements on other layout levels or quantities of elements in layout design 100A are within the scope of the present disclosure.

FIG. 1B is a diagram of layout design 100B of an integrated circuit, in accordance with some embodiments. Layout design 100B is a layout diagram of integrated circuit 200B of FIG. 2B.

Figure 2B:
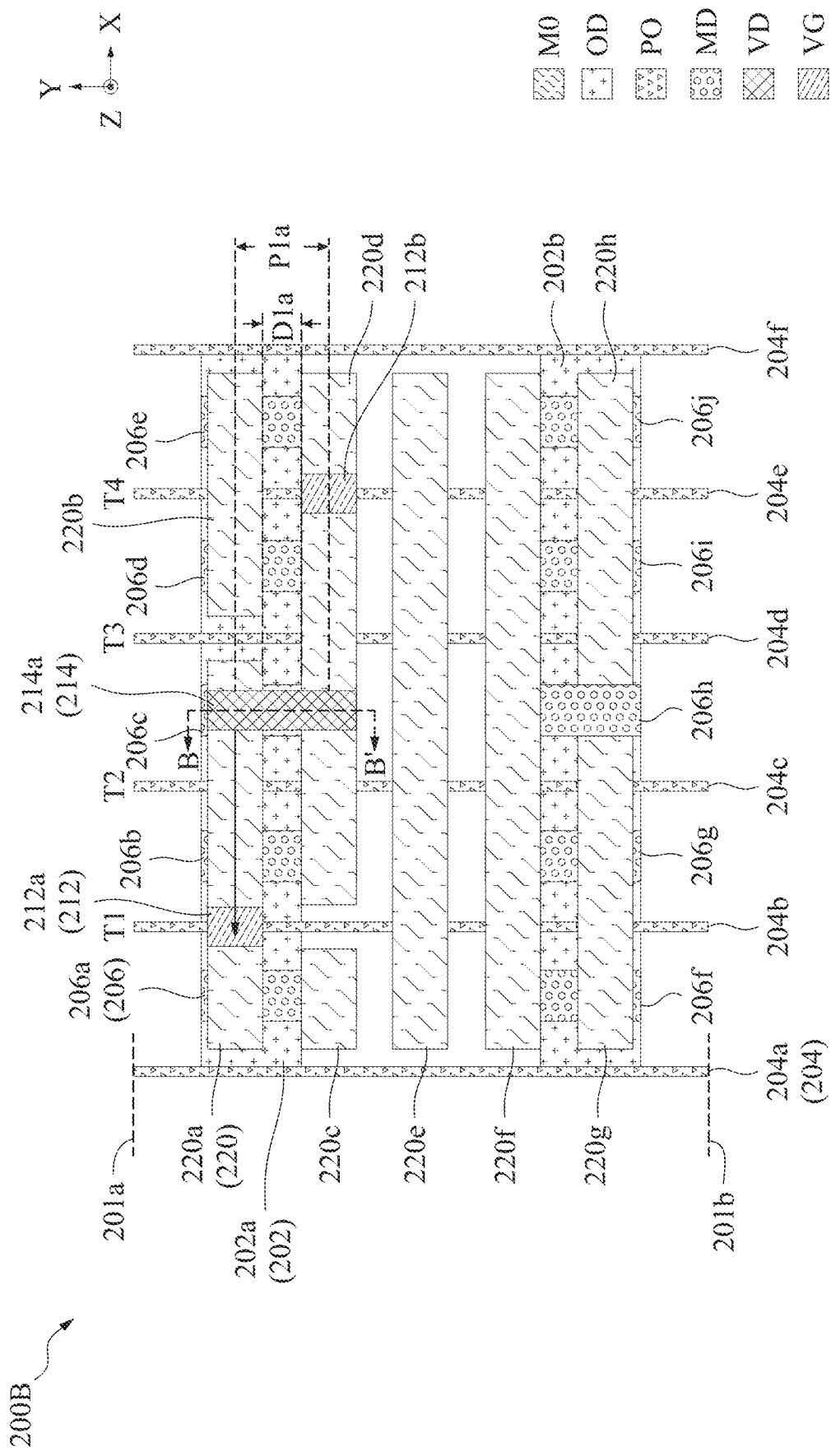

Layout design 100B is usable to manufacture integrated circuit 200B of FIG. 2B.

Layout design 100B is a variation of layout design 100A (FIG. 1A), and similar detailed description is therefore omitted. For example, layout design 100B illustrates an example of where a slotted via pattern (e.g., via pattern 114a) replaces via patterns 110a and 110b.

In comparison with layout design 100A of FIG. 1A, a set of via patterns 114 of layout design 100B replaces the set of via patterns 110 of FIG. 1A, and similar detailed description is therefore omitted.

The set of via patterns 114 includes at least via pattern 114a. Other number of patterns in the set of via patterns 114 are within the scope of the present disclosure.

The set of via patterns 114 is usable to manufacture a corresponding set of vias 214 of integrated circuit 200A-200B or 300A-700C. In some embodiments, via pattern 114a of the set of via patterns 114 is usable to manufacture corresponding vias 214a of the set of vias 214 of integrated circuit 200A-200B or 300A-700C.

The set of via patterns 114 is positioned at the VD level of one or more of layout design 100A-100B or integrated circuit 200A-200B or 300A-700C. Other layout levels are within the scope of the present disclosure.

In some embodiments, the set of via patterns 114 is between the set of contact patterns 106 and the set of conductive feature patterns 120. In some embodiments, the size of one or more via patterns in the set of vias patterns 114 can be increased thereby reducing resistance compared to other approaches.

As shown in FIG. 1B, in some embodiments, the set of via patterns 114 have a color A or B, and the set of via patterns 114 with a same color are to be formed on a same mask of a single mask or multiple mask set. In some embodiments, there is more than one color in layout design 100B.

In some embodiments, each via pattern in the set of via patterns 114 extends in the second direction Y from at least a first metal routing track to at least a second metal routing track. For example, via pattern 114a extends in the second direction Y from a first end of conductive feature pattern 120d to a first end of conductive feature pattern 120a. In some embodiments, each via pattern in the set of via patterns 114 extends in the second direction Y from at least a first metal routing track to at least a second metal routing track that is located on an opposite end of the cell 101.

In some embodiments, via patterns in the set of via patterns 114 are separated from each other by at least pitch P1a.

In some embodiments, a length of each via pattern in the set of via patterns 114 in the second direction Y is greater than or equal to pitch P1a. In some embodiments, a length of each via pattern in the set of via patterns 114 in the second direction Y is at least equal to a length of each contact of the set of contact patterns 106 that is overlapped by the corresponding via pattern in the set of via patterns 114.

In some embodiments, a side of each conductive feature pattern of the set of conductive features patterns 120 is separated from a side of an adjacent conductive feature pattern in the set of conductive feature patterns 120 in the second direction Y by at least a distance D1a. For example, conductive feature pattern 120a is separated from conductive feature pattern 120d in the second direction Y by the distance D1a. In some embodiments, the distance D1a is measured from a side of at least conductive feature pattern in the set of conductive feature patterns 120 that is in a first routing track to a side of at least another conductive feature pattern in the set of conductive feature patterns 120 that is in a second routing track different from the first routing track.

In some embodiments, the distance D1a is equal to a second range. In some embodiments, the second range ranges from about 10 nm to about 20 nm. Other ranges or values for the second range are within the scope of the present disclosure.

In some embodiments, if the distance D1a is less than the second range, then the distance D1a may be insufficient to create enough separation between adjacent conductive feature patterns in the set of conductive feature patterns 120 thereby decreasing the manufacturing yield of at least one of the set of conductors 220 manufactured by the set of conductive feature patterns 120 or the set of vias 210 or 214 manufactured by the corresponding set of via patterns 110 or 114 compared to other approaches.

In some embodiments, if the distance D1a is equal to the second range, then the distance D1a is sufficient to create enough separation between adjacent conductive feature patterns in the set of conductive feature patterns 120 thereby increasing the manufacturing yield of at least one of the set of conductors 220 manufactured by the set of conductive feature patterns 120 or the set of vias 210 or 214 manufactured by the corresponding set of via patterns 110 or 114 compared to other approaches.

In some embodiments, if the distance D1a is greater than the second range, then the distance D1a is sufficient to create enough separation between adjacent conductive feature patterns in the set of conductive feature patterns 120 thereby increasing the manufacturing yield of at least one of the set of conductors 220 manufactured by the set of conductive feature patterns 120 or the set of vias 210 or 214 manufactured by the corresponding set of via patterns 110 or 114 compared to other approaches.

In some embodiments, the distance D1a is greater than or equal to a third range. In some embodiments, the third range ranges from about 20 nm to about 50 nm. Other ranges or values for the third range are within the scope of the present disclosure.

In some embodiments, if the distance D1a is less than the third range, then the distance D1a may be insufficient to create enough separation between adjacent conductive feature patterns in the set of conductive feature patterns 120 thereby decreasing the manufacturing yield of at least one of the set of conductors 220 manufactured by the set of conductive feature patterns 120 or the set of vias 210 or 214 manufactured by the corresponding set of via patterns 110 or 114 compared to other approaches.

In some embodiments, if the distance D1a is greater than or equal to the third range, then the distance D1a is sufficient to create enough separation between adjacent conductive feature patterns in the set of conductive feature patterns 120 thereby increasing the manufacturing yield of at least one of the set of conductors 220 manufactured by the set of conductive feature patterns 120 or the set of vias 210 or 214 manufactured by the corresponding set of via patterns 110 or 114 compared to other approaches.

Other configurations, arrangements on other layout levels or quantities of patterns in at least set of via patterns 114 are within the scope of the present disclosure.

In some embodiments, layout design 100B achieves one or more benefits described herein including the details discussed above with respect to layout design 100A.

Other configurations, arrangements on other layout levels or quantities of elements in layout design 100B are within the scope of the present disclosure.

Figure 2C:
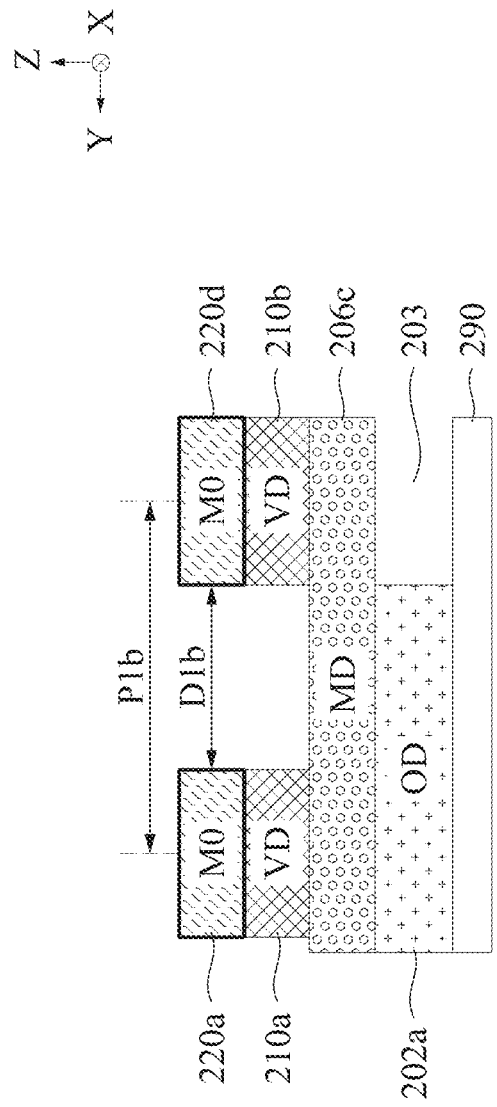

FIGS. 2A and 2C are diagrams of an integrated circuit 200A, in accordance with some embodiments.

Figure 2D:
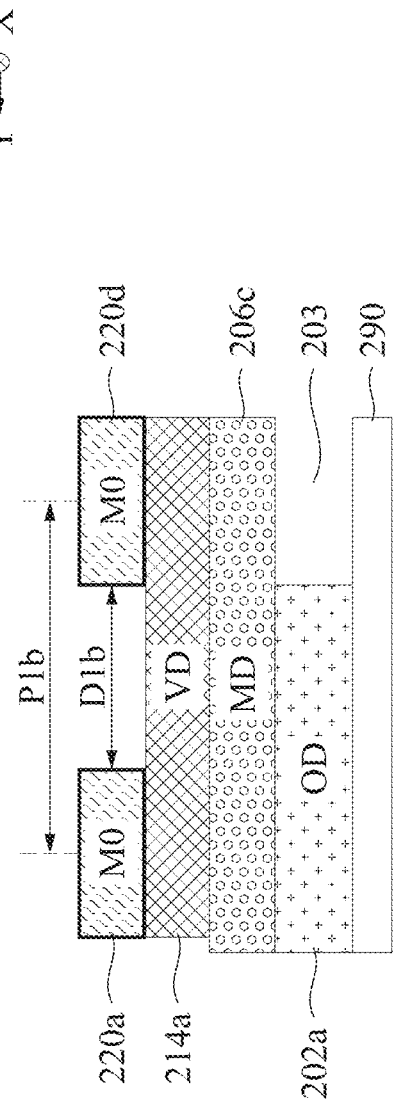

FIGS. 2B and 2D are diagrams of an integrated circuit 200B, in accordance with some embodiments.

FIG. 2A is a top view of integrated circuit 200A, in accordance with some embodiments.

FIG. 2B is a top view of integrated circuit 200B, in accordance with some embodiments.

FIGS. 2C-2D are corresponding cross-sectional views of corresponding integrated circuits 200A-200B, in accordance with some embodiments.

FIG. 2C is a cross-sectional view of integrated circuit 200A as intersected by plane A-A', in accordance with some embodiments. FIG. 2D is a cross-sectional view of integrated circuit 200B as intersected by plane B-B', in accordance with some embodiments.

Components that are the same or similar to those in one or more of FIGS. 1A-2B, 2A-2D and 3A-7C (shown below) are given the same reference numbers, and detailed description thereof is thus omitted.

Integrated circuit 200A is manufactured by layout design 100A. Structural relationships including alignment, lengths and widths, as well as configurations and layers of integrated circuit 200A are similar to the structural relationships and configurations and layers of layout design 100A of FIG. 1A, and similar detailed description will not be described in at least FIGS. 2A and 2C, for brevity.

For example, in some embodiments, at least pitch P1a or distance D1a of layout designs 100A-100B are similar to corresponding pitch P1b or distance D1b of corresponding integrated circuit 200A-200B, and similar detailed description is omitted for brevity.

For example, in some embodiments, at least one or more widths, lengths or pitches of layout design 100A-100B are similar to corresponding widths, lengths or pitches of corresponding integrated circuit 200A-200B, and similar detailed description is omitted for brevity. For example, in some embodiments, at least cell boundaries 101a, 101b, 101c or 101d or a mid-point (not labelled) of layout design 100A-100B is similar to at least corresponding cell boundaries 201a, 201b, 201c or 201d or a mid-point (not labelled) of corresponding integrated circuit 200A-200B, and similar detailed description is omitted for brevity.

Integrated circuit 200A includes at least the set of active regions 202, an insulating region 203, the set of gates 204, the set of contacts 206, the set of vias 210, the set of vias 212, the set of conductors 220 and a substrate 290.

The set of active regions 202 includes one or more of active regions 202a or 202b embedded in a substrate 290. Substrate has a front-side (not labelled) and a back-side (not labelled) opposite from the front-side. In some embodiments, at least the set of active regions 202, the set of gates 204, the set of contacts 206, the set of vias 210, the set of vias 212 and the set of conductors 220 are formed in the front-side of substrate 290.

In some embodiments, the set of active regions 202 corresponds to nanosheet structures (not labelled) of nanosheet transistors. In some embodiments, the set of active regions 202 include drain regions and source regions grown by an epitaxial growth process. In some embodiments, the set of active regions 202 include drain regions and source regions that are grown with an epitaxial material at the corresponding drain regions and source regions.

Other transistor types are within the scope of the present disclosure. For example, in some embodiments, the set of active regions 202 corresponds to nanowire structures (not shown) of nanowire transistors. In some embodiments, the set of active regions 202 corresponds to planar structures (not shown) of planar transistors. In some embodiments, the set of active regions 202 corresponds to fin structures (not shown) of finFETs. In some embodiments, the set of active regions 202 corresponds to structures (not shown) of complementary FETs (CFETs).

In some embodiments, active region 202a corresponds to source and drain regions of NMOS transistors of integrated circuit 200A-200B or 300A-700C, and active region 202b corresponds to source and drain regions of PMOS transistors of integrated circuit 200A-200B or 300A-700C.

In some embodiments, active region 202a corresponds to source and drain regions of PMOS transistors of integrated circuit 200A-200B or 300A-700C, and active region 202b corresponds to source and drain regions of NMOS transistors of integrated circuit 200A-200B or 300A-700C.

In some embodiments, at least active region 202a is an N-type doped S/D region, and active region 202b is a P-type doped S/D region embedded in a dielectric material of substrate 290. In some embodiments, at least active region 202a is a P-type doped S/D region, and active region 202b is an N-type doped S/D region embedded in a dielectric material of substrate 290.

Other configurations, arrangements on other layout levels or quantities of structures in the set of active regions 202 are within the scope of the present disclosure.

Figure 8:
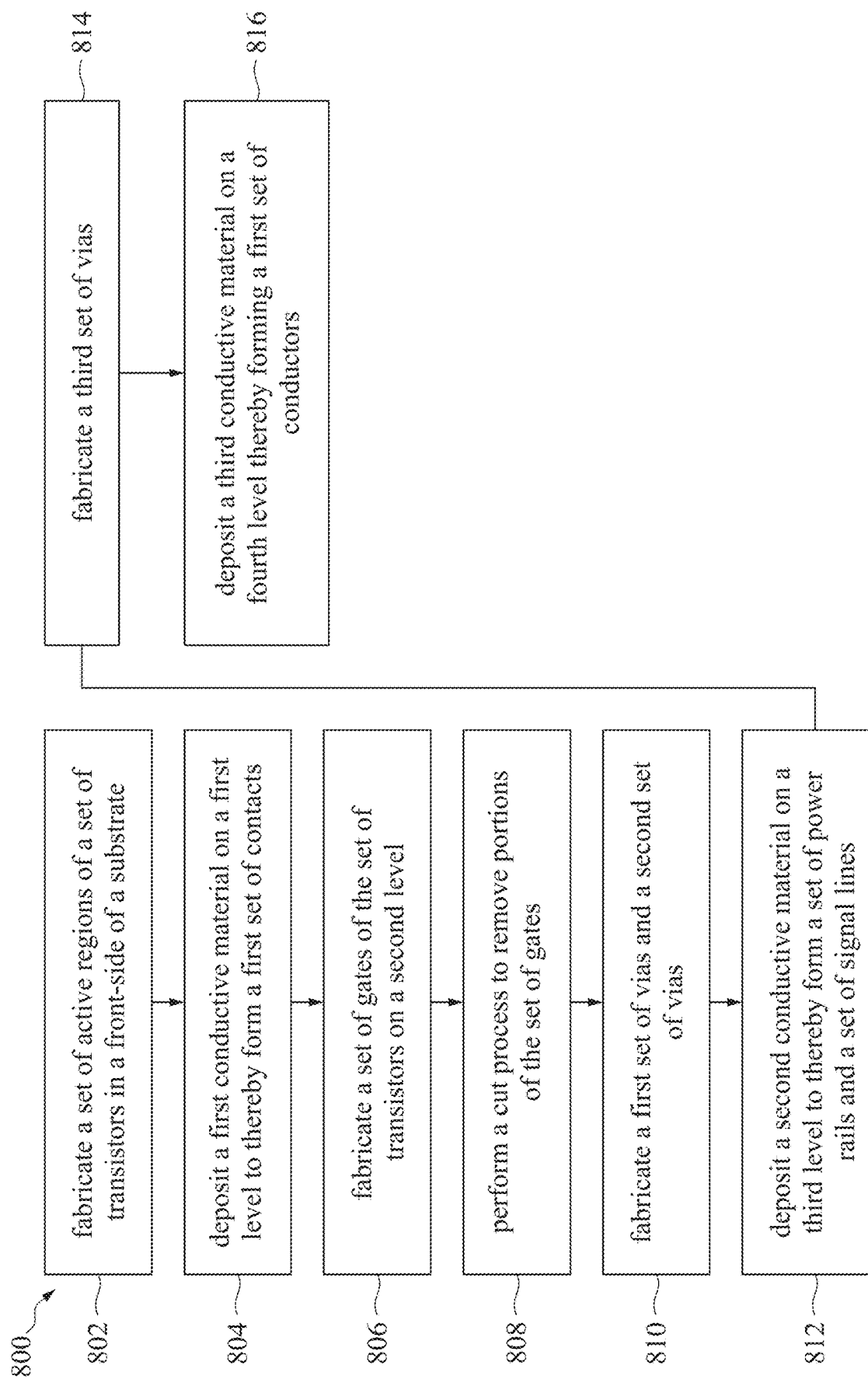
FIG. 8 is a flow chart of a method of forming or manufacturing an integrated circuit in accordance with some embodiments.

Insulating region 203 is configured to electrically isolate one or more elements of the set of active regions 202, the set of gates 204, the set of contacts 206, the set of vias 210, the set of vias 212 and the set of conductors 220 from one another. In some embodiments, insulating region 203 includes multiple insulating regions deposited at different times from each other during method 800 (FIG. 8). In some embodiments, insulating region is a dielectric material. In some embodiments, the dielectric material includes silicon dioxide, silicon oxy-nitride, or the like.

Other configurations, arrangements on other layout levels or other numbers of portions in insulating region 203 are within the scope of the present disclosure.

The set of gates 204 includes one or more of gates 204a, . . . , 204e or 204f.

In some embodiments, one or more gates of the set of gates 204 is divided into two or more discontinuous gate portions, and include a removed gate portion. In some embodiments, the removed gate portion is removed during operation 906 of FIG. 9 (described below).

In some embodiments, at least a portion of gate 204a, . . . , 204e or 204f is a gate of NMOS transistors of integrated circuits 200A-200B and 300A-700C, and at least a portion of gate 204a, . . . , 204e or 204f is a gate of PMOS transistors of integrated circuits 200A-200B and 300A-700C.

In some embodiments, at least a portion of gate 204b, 204c, 204d or 204e is a gate of corresponding transistor T1, T2, T3 or T4 of integrated circuits 200A-200B.

In some embodiments, at least gate 204a, . . . , 204e or 204f corresponds to a dummy gate. In some embodiments, a dummy gate is a gate of a non-functional transistor.

Other configurations, arrangements on other layout levels or quantities of gates in the set of gates 204 are within the scope of the present disclosure.

The set of contacts 206 includes one or more of contact 206a, . . . , 206i or 206j. The set of contacts 206 are located on the front-side of integrated circuit 200A-200B. The set of contacts 206 overlap the set of active regions 202.

Each contact of the set of contacts 206 corresponds to one or more drain or source terminals of PMOS or NMOS transistors of integrated circuits 200A-200B.

In some embodiments, one or more of contact 206a, . . . , 206e is a source/drain terminal of NMOS transistors of integrated circuits 200A-200B and 300A-700C, and one or more of contact 206f, . . . , 206j is a source/drain terminal of PMOS transistors of integrated circuits 200A-200B and 300A-700C.

In some embodiments, one or more of contact 206a, . . . , 206e is a source/drain terminal of PMOS transistors of integrated circuits 200A-200B and 300A-700C, and one or more of contact 206f, . . . , 206j is a source/drain terminal of NMOS transistors of integrated circuits 200A-200B and 300A-700C.

In some embodiments, one or more contacts of the set of contacts 206 overlaps a pair of active regions of the set of active regions 202, thereby electrically coupling the pair of active regions of the set of active regions 202 and the source or drain of the corresponding transistors.

Other lengths or widths for the set of contacts 206 are within the scope of the present disclosure. Other configurations, arrangements on other layout levels or quantities of conductors in the set of contacts 206 are within the scope of the present disclosure.

The set of vias 210 includes one or more of vias 210a or 210b. In some embodiments, the set of vias 210 are between the set of contacts 206 and a set of conductors 220. The set of vias 210 is embedded in insulating region 203.

The set of vias 210 is located where the set of contacts 206 are overlapped by the set of conductors 220. Via 210a or 210b is located where contact 206c is overlapped by corresponding conductor 220a or 220d.

The set of vias 210 are configured to electrically couple the set of active regions 202 and the set of conductors 220 together by the set of contacts 206. In some embodiments, at least the set of contacts 206 or the set of vias 210 are configured to electrically couple at least one conductor in the set of conductors 220 to at least another conductor in the set of conductors 220. For example, in some embodiments, contact 206c is electrically coupled to each of vias 210a and 210b, and at least via 210a or 210b is electrically coupled to corresponding conductors 220a and 220d. Thus, in these embodiments, contact 206c and vias 210a and 210b electrically couple conductors 220a and 220d to each other.

In some embodiments, vias in the set of vias 210 that are positioned below adjacent M0 routing tracks are separated from each other by pitch P1b.

In some embodiments, the pitch P1b is related to a color associated with the set of vias 210. As shown in FIG. 2A, in some embodiments, the set of vias 210 have a color A or B. The color A or B indicates that vias 210 with a same color are formed by a same mask of a multiple mask set, and vias 210 with a different color are formed by a different corresponding mask of the multiple mask set. Two colors A and B are depicted in FIG. 2A as an example. FIG. 2B shows one color as an example. In some embodiments, there are more or less than two colors in integrated circuit 200A-200B.

In some embodiments, the pitch P1b is less than or equal to the first range. In some embodiments, the first range ranges from about 20 nm to about 60 nm. In some embodiments, the pitch P1b is greater than the first range. Other ranges or values for pitch P1b of the set of vias 210 are within the scope of the present disclosure.

In some embodiments, if the pitch P1b is less than or equal to the first range, then the set of vias 210 have at least color A and B, and are formed by different corresponding masks of a multiple mask set. For example, in some embodiments, if the pitch P1b is less than or equal to the first range, and the set of vias 210 have at least color A and B, and are formed by different corresponding masks of a multiple mask set, then the pitch P1b is sufficient to create enough separation between vias in the set of vias 210 that are manufactured by different masks thereby increasing the manufacturing yield of the set of vias 210 manufactured by the set of via patterns 110 compared to other approaches.

In some embodiments, if the pitch P1b is less than or equal to the first range, and the set of vias 210 have a single color (e.g., color A or B) and are formed by a single mask, then the pitch P1b is not sufficient to create enough separation between vias in the set of vias 210 that are manufactured by a single mask, thereby reducing the manufacturing yield of the set of vias 210 manufactured by the set of via patterns 110 compared to other approaches.

In some embodiments, if the pitch P1b is greater than the first range, then the set of vias 210 have a single color (e.g., color A or B) and are formed by a single mask. For example, in some embodiments, if the pitch P1b is greater than the first range, and the set of vias 210 have a single color (e.g., color A or B) and are formed by a single mask, then the pitch P1b is sufficient to create enough separation between vias in the set of vias 210 that are manufactured by a single mask, thereby increasing the manufacturing yield of the set of vias 210 manufactured by the set of via patterns 110 compared to other approaches.

In some embodiments, the set of vias 210 are configured to electrically couple a corresponding source or drain region of the set of active regions 202 to the set of conductors 220.

Other configurations, arrangements on other layout levels or quantities of vias in the set of vias 210 are within the scope of the present disclosure.

The set of vias 212 includes one or more of vias 212a or 212b. In some embodiments, the set of vias 212 are between the set of gates 204 and the set of conductors 220. The set of vias 212 is embedded in insulating region 203.

The set of vias 212 is located where the set of gates 204 are overlapped by the set of conductors 220. Via 212a or 212b is located where corresponding gate 204b or 204e is overlapped by corresponding conductor 220a or 220d.

The set of vias 212 is configured to electrically couple the set of gates 204 and the set of conductors 220 together. At least via 212a or 212b is configured to electrically couple corresponding gate 204b or 204e and corresponding conductor 220a or 220d together.

In some embodiments, the set of vias 212 are configured to electrically couple a corresponding gate of the set of gates 204 to one or more conductors of the set of conductors 220.

Other configurations, arrangements on other layout levels or quantities of vias in the set of vias 212 are within the scope of the present disclosure.

The set of conductors 220 includes one or more of conductors 220a, 220b, 220c, . . . , 220g or 220h. In some embodiments, the set of conductors 220 corresponds to a set of conductive structures. The set of conductors 220 is embedded in insulating region 203.

The set of conductors 220 overlap the set of contacts 206 and the set of gates 204. Conductors 220a and 220b overlap active region 202a. Conductors 220g and 220h overlap active region 202b.

In some embodiments, the set of conductors 220 corresponds to 5 M0 routing tracks in integrated circuit 200A-200B. Other numbers of M0 routing tracks are within the scope of the present disclosure.

In some embodiments, integrated circuit 200A-200B further include power rails similar to power rails 340a-340b of FIGS. 3A-7C, and is not shown in FIGS. 2A-2B for ease of illustration, and similar detailed description is omitted for brevity.

In some embodiments, the set of conductors 220 is configured to provide the routing of signals, and are referred to as "signal lines." For example, conductor 220a or 200d is configured to route signals to/from other portions of integrated circuit 200A-200B or other devices (not shown for ease of illustration).

In some embodiments, gate 204b of transistor T1, a drain/source of transistors T2 and T3, and gate 204e of transistor T4 are electrically coupled together by at least conductor 220a or 220d. For example, in some embodiments, gate 204b or 204e is electrically coupled to corresponding conductor 220a or 220d by corresponding via 212a or 212b. Furthermore, conductors 220a and 220d are electrically coupled to each other by contact 206c and vias 210a and 210b.

Other configurations, arrangements on other layout levels or quantities of conductors in the set of conductors 220 are within the scope of the present disclosure.

In some embodiments, by vias 210a and 210b overlapping contact 206c, and by vias 210a and 210b being separated from each other in the second direction Y by one metal routing track, conductors 220a and 220d in the set of conductors 220 are located in adjacent routing tracks and are electrically connected together by not utilizing other metal routing tracks in the second direction Y or in other metal layers, thereby saving routing resources compared to other approaches.

In some embodiments, by integrated circuit 200A-200B saving routing resources results in integrated circuit 200A-200B having at least smaller area, more routing flexibility, reduced power or improved performance compared to other approaches.

In some embodiments, by integrated circuit 200A-200B utilizing the set of conductors 220 as metal routing tracks that extend in the first direction X, and not utilizing other metal routing tracks in the second direction Y, integrated circuit 200A-200B can reduce and minimize the space between adjacent metal routing tracks in the second direction Y because the set of conductors 220 has a regular pattern that is adaptable to one or more different processes than other approaches.

In some embodiments, at least one gate region of the set of gates 204 are formed using a doped or non-doped polycrystalline silicon (or polysilicon). In some embodiments, at least one gate region of the set of gates 204 include a metal, such as Al, Cu, W, Ti, Ta, TiN, TaN, NiSi, CoSi, other suitable conductive materials, or combinations thereof.

In some embodiments, at least one conductor of the set of contacts 206, at least one conductor of the set of conductors 220, at least one via of the set of vias 210, at least one via of the set of vias 212 or at least one via of the set of vias 214 (FIG. 2B), at least one conductor of the set of conductors 340, at least one conductor of the set of conductors 560, at least one via of the set of vias 562 includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

Other materials, configurations, arrangements on other layout levels or quantities of elements in integrated circuit 200A are within the scope of the present disclosure.

FIGS. 2B and 2D are diagrams of an integrated circuit 200B, in accordance with some embodiments.

Integrated circuit 200B is manufactured by layout design 100B. Structural relationships including alignment, lengths and widths, as well as configurations and layers of integrated circuit 200B are similar to the structural relationships and configurations and layers of layout design 100B of FIGS. 1B, and similar detailed description will not be described in at least FIGS. 2B and 2D, for brevity.

Integrated circuit 200B includes at least the set of active regions 202, an insulating region 203, the set of gates 204, the set of contacts 206, a set of vias 214, the set of vias 212, the set of conductors 220 and a substrate 290.

Integrated circuit 200B is a variation of integrated circuit 200A (FIG. 2A), and similar detailed description is therefore omitted. For example, integrated circuit 200B illustrates an example of where a slotted via (e.g., via 214a) replaces vias 210a and 210b.

In comparison with integrated circuit 200A of FIG. 2A, a set of vias 214 of integrated circuit 200B replaces the set of vias 210 of FIG. 2A, and similar detailed description is therefore omitted.

The set of vias 214 includes at least via 214a. Other numbers of vias in the set of vias 214 are within the scope of the present disclosure.

In some embodiments, the set of vias 214 is between the set of contacts 206 and the set of conductors 220. In some embodiments, the size of one or more vias in the set of vias 214 can be increased thereby reducing resistance compared to other approaches.

In some embodiments, by including via 214a, via 214a directly contacts the contact 206c over a larger surface area than approaches without via 214a, thereby reducing resistance and providing additional routing resources.

As shown in FIG. 1B, in some embodiments, the set of vias 214 have a color A or B. In some embodiments, there is more than one color in integrated circuit 200B.

In some embodiments, each via in the set of vias 214 extends in the second direction Y from at least a first metal routing track to at least a second metal routing track. For example, via 214a extends in the second direction Y from a first end of conductor 220d to a first end of conductor 220a. In some embodiments, each via in the set of vias 214 extends in the second direction Y from at least a first metal routing track to at least a second metal routing track that is located on an opposite end of the cell 201.

In some embodiments, vias in the set of vias 214 are separated from each other by at least pitch P1b.

In some embodiments, a length of each via in the set of vias 214 in the second direction Y is greater than or equal to pitch P1b. In some embodiments, a length of each via in the set of vias 214 in the second direction Y is at least equal to a length of each contact of the set of contacts 206 that is overlapped by the corresponding via in the set of vias 214.

In some embodiments, a side of each conductor of the set of conductors 220 is separated from a side of an adjacent conductor in the set of conductors 220 in the second direction Y by at least a distance D1b. For example, conductor 220a is separated from conductor 220d in the second direction Y by the distance D1b. In some embodiments, the distance D1b is measured from a side of at least conductor in the set of conductors 220 that is in a first routing track to a side of at least another conductor in the set of conductors 220 that is in a second routing track different from the first routing track.

In some embodiments, the distance D1b is equal to the second range. In some embodiments, the second range ranges from about 10 nm to about 20 nm. Other ranges or values for the second range are within the scope of the present disclosure.

In some embodiments, if the distance D1b is less than the second range, then the distance D1b may be insufficient to create enough separation between adjacent conductors in the set of conductors 220 thereby decreasing the manufacturing yield of at least one of the set of conductors 220 or the set of vias 210 or 214 compared to other approaches.

In some embodiments, if the distance D1b is equal to the second range, then the distance D1b is sufficient to create enough separation between adjacent conductors in the set of conductors 220 thereby increasing the manufacturing yield of at least one of the set of conductors 220 or the set of vias 210 or 214 compared to other approaches.

In some embodiments, if the distance D1b is greater than the second range, then the distance D1b is sufficient to create enough separation between adjacent conductors in the set of conductors 220 thereby increasing the manufacturing yield of at least one of the set of conductors 220 or the set of vias 210 or 214 compared to other approaches.

In some embodiments, the distance D1b is greater than or equal to the third range. In some embodiments, the third range ranges from about 20 nm to about 50 nm. Other ranges or values for the third range are within the scope of the present disclosure.

In some embodiments, if the distance D1b is less than the third range, then the distance D1b may be insufficient to create enough separation between adjacent conductors in the set of conductors 220 thereby decreasing the manufacturing yield of at least one of the set of conductors 220 or the set of vias 210 or 214 compared to other approaches.

In some embodiments, if the distance D1b is greater than or equal to the third range, then the distance D1b is sufficient to create enough separation between adjacent conductors in the set of conductors 220 thereby increasing the manufacturing yield of at least one of the set of conductors 220 or the set of vias 210 or 214 compared to other approaches.

Other configurations, arrangements on other layout levels or quantities of vias in at least set of vias 214 are within the scope of the present disclosure.

In some embodiments, integrated circuit 200B achieves one or more benefits described herein including the details discussed above with respect to integrated circuit 200A.

Other configurations, arrangements on other layout levels or quantities of elements in integrated circuit 200B are within the scope of the present disclosure.

Figure 3A:
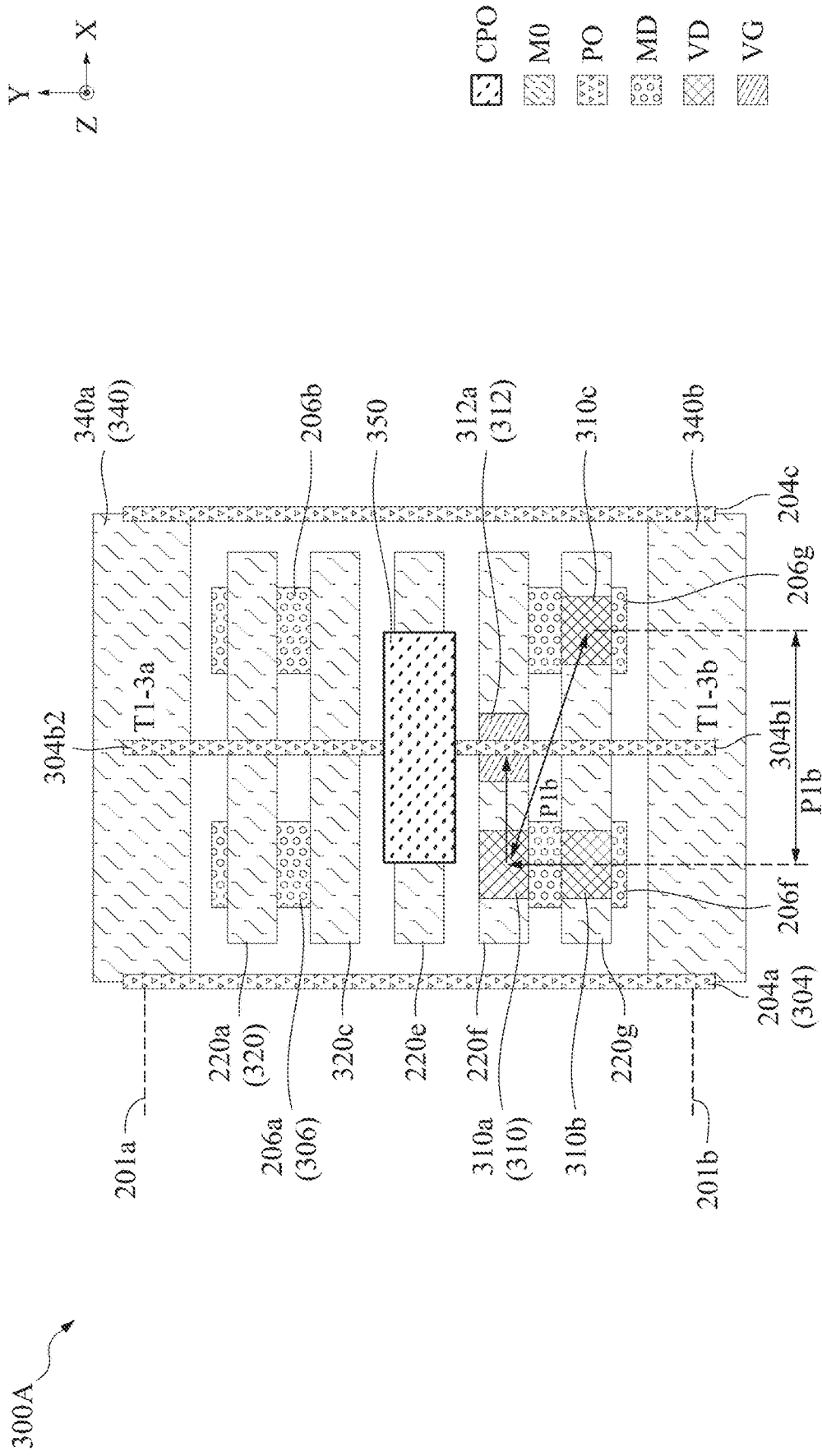
FIG. 3A is a top view of an integrated circuit, in accordance with some embodiments.

FIG. 3A is a top view of an integrated circuit 300A, in accordance with some embodiments.

Integrated circuit 300A is manufactured by a corresponding layout design similar to integrated circuit 300A. For brevity FIGS. 3A-7C are described as a corresponding integrated circuit 300A-700C, but in some embodiments, FIGS. 3A-7C also correspond to layout designs similar to layout designs 100A-100B, structural elements of integrated circuit 300A-700C also correspond to layout patterns, and structural relationships including alignment, lengths and widths, as well as configurations and layers of a corresponding layout design of integrated circuit 300A-700C are similar to the structural relationships and configurations and layers of integrated circuit 300A-700C, and similar detailed description will not be described for brevity.

In some embodiments, at least integrated circuit 300A, 300B, 400A, 400B, 500A, 500B, 600A, 600B, 700A, 700B or 700C is manufactured by a layout design similar to at least one of layout design 100A or 100B, and similar detailed description is therefore omitted. Structural relationships including alignment, lengths and widths, as well as configurations and layers of at least integrated circuit 300A, 300B, 400A, 400B, 500A, 500B, 600A, 600B, 700A, 700B or 700C are similar to the structural relationships and configurations and layers of integrated circuit 200A-200B of FIGS. 2A-2D, and similar detailed description will not be described in at least FIGS. 3A-7C, for brevity.

Integrated circuit 300A is a variation of integrated circuit 200A (FIG. 2A), and similar detailed description is therefore omitted.

Integrated circuit 300A includes at least a set of gates 304, a set of contacts 306, a set of vias 310, a set of vias 312, a set of conductors 320, and a set of conductors 340.

For ease of illustration, integrated circuits 300A-700C are not shown with a set of active regions, but each of integrated circuits 300A-700C further include a set of active regions that is similar to the set of active regions 202, and similar detailed description is therefore omitted.

The set of gates 304 replace the set of gates 204 of FIGS. 2A-2D, the set of contacts 306 replace the set of contacts 206 of FIGS. 2A-2D, the set of vias 310 replaces the set of vias 210 of FIGS. 2A-2D, and the set of vias 312 replaces the set of vias 212 of FIGS. 2A-2D, and similar detailed description is therefore omitted.

The set of gates 304 includes one or more of gates 204a, 304b1, 304b2 or 204c.

In comparison with integrated circuit 200A of FIGS. 2A-2D, gates 304b1 and 304b2 replace gate 204b, and similar detailed description is therefore omitted.

Figure 9:
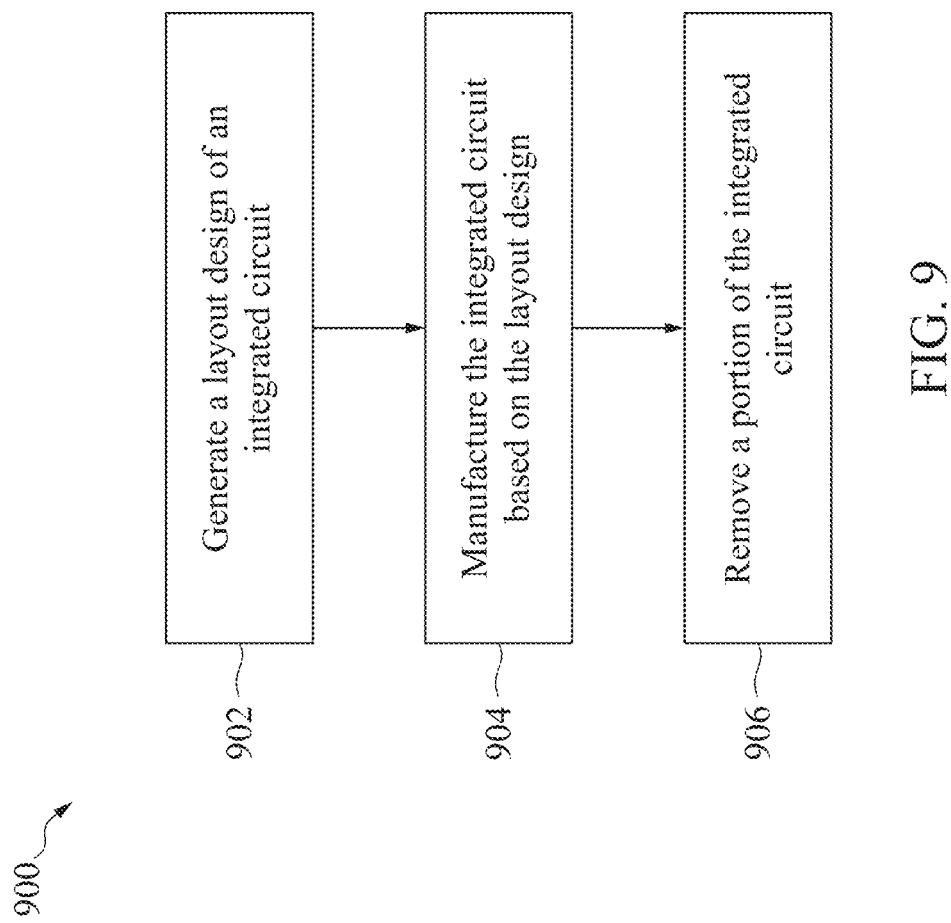
FIG. 9 is a flow chart of a method of manufacturing an IC device, in accordance with some embodiments.

In comparison with gate 204b of FIGS. 2A-2D, gates 304b1 and 304b2 are separated by a removed gate portion 350 similar to a poly cut feature pattern, and similar detailed description is therefore omitted. In some embodiments, the removed gate portion 350 is removed during operation 906 of method 900 (FIG. 9).

Figure 3B:
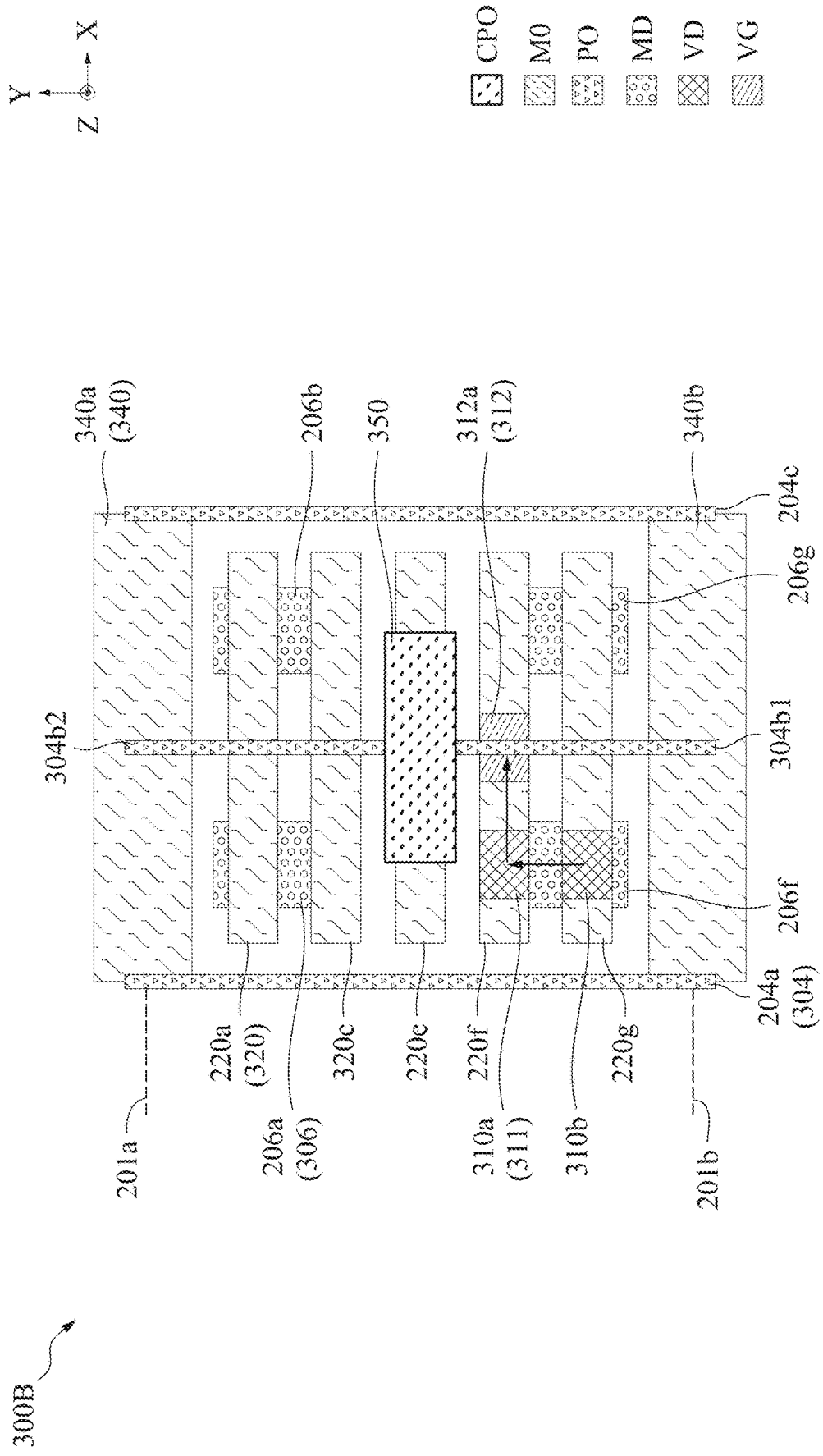
FIG. 3B is a top view of an integrated circuit, in accordance with some embodiments.

In some embodiments, FIGS. 3A-3B correspond to a layout design, and the removed gate portion 350 corresponds to a poly cut feature pattern. In some embodiments, the poly cut feature pattern is usable to identify a corresponding location of a removed portion of corresponding gate portion 350 of integrated circuit 300A that is removed during operation 906 of method 900 (FIG. 9).

Other configurations, arrangements on other layout levels or quantities of gates in the set of gates 304 are within the scope of the present disclosure.

The set of contacts 306 includes at least contact 206a, 206b, 206f or 206g.

Contact 206f is electrically coupled to a source/drain of a transistor T1-3b. Contact 206g is electrically coupled to a drain/source of transistor T1-3b.

Other configurations, arrangements on other layout levels or quantities of contacts in the set of contacts 306 are within the scope of the present disclosure.

The set of vias 310 includes at least via 310a, 310b or 310c.

In comparison with integrated circuit 200A, at least via 310a or 310b replaces at least corresponding via 210a or 210b, and similar detailed description is therefore omitted. In comparison with integrated circuit 200A, via 310c is similar to at least via 210a or 210b, and similar detailed description is therefore omitted.

Via 310a is between conductor 220f and contact 206f. Via 310a is configured to electrically couple conductor 220f and contact 206f together. Conductor 220f is electrically coupled to the source/drain of transistor T1-3b by contact 206f and via 310a.

Via 310b is between conductor 220g and contact 206f. Via 310b is configured to electrically couple conductor 220g and contact 206f together. Conductor 220g is electrically coupled to the source/drain of transistor T1-3b by contact 206f and via 310b.

Via 310c is between conductor 220g and contact 206g. Via 310c is configured to electrically couple conductor 220g and contact 206g together. Conductor 220g is electrically coupled to the drain/source of transistor T1-3b by contact 206g and via 310c.

In some embodiments, at least the set of contacts 306 or the set of vias 310 are configured to electrically couple at least one conductor in the set of conductors 320 to at least another conductor in the set of conductors 320. For example, in some embodiments, contact 206f and vias 310a and 310b electrically couple conductors 220f and 220g to each other.

In some embodiments, via 310a and via 310c are separated from each other by pitch P1b. In some embodiments, via 310b and via 310c are separated from each other by pitch P1b.

Other configurations, arrangements on other layout levels or quantities of vias in the set of vias 310 are within the scope of the present disclosure.

The set of vias 312 includes at least via 312a.

In comparison with integrated circuit 200A, via 312a replaces via 212a, and similar detailed description is therefore omitted.

Via 312a is between conductor 220f and gate 304b1. Via 312a is configured to electrically couple conductor 220f and gate 304b1 together.

Other configurations, arrangements on other layout levels or quantities of vias in the set of vias 312 are within the scope of the present disclosure.

The set of conductors 320 includes at least conductor 220a, 320c, 220e, 220f or 220g.

In comparison with integrated circuit 200A, conductor 320c replaces at least conductor 220c or 220d, and similar detailed description is therefore omitted.

Conductors 220f and 220g are electrically coupled to each other by at least contact 206f and vias 310a and 310b.

In some embodiments, gate 304b1 of transistor T1-3b, a drain/source of transistor T1-3b and a source/drain of transistor T1-3b are electrically coupled together by at least conductors 220f and 220g. For example, in some embodiments, gate 304b1 is electrically coupled to conductor 220f by via 312a, and conductor 220f is electrically coupled to contact 206f by via 310a. Furthermore, contact 206f is electrically coupled to conductor 220g by via 310b, and conductor 220g is electrically coupled to contact 206g by via 310c.

Other configurations, arrangements on other layout levels or quantities of conductors in the set of conductors 320 are within the scope of the present disclosure.

The set of conductors 340 includes at least conductor 340a or 340b.

In some embodiments, at least conductor 340a or 340b of the set of conductors 340 is configured to provide power to the set of active regions (not shown) or the set of gates 304, and thus conductors 340a and 340b are referred to as "power rails."

In some embodiments, the set of conductors 340 is configured to provide a first supply voltage of a voltage supply VDD or a second supply voltage of a reference voltage supply VSS to the integrated circuit, such as integrated circuit 300A. In some embodiments, the first supply voltage is different from the second supply voltage.

In some embodiments, conductor 340a is configured to provide the first supply voltage of voltage supply VDD to the sources/drains of an active region similar to active region 202a, and conductor 340b is configured to provide the second supply voltage of reference voltage supply VSS to the sources/drains of an active region similar to active region 202b.

In some embodiments, conductor 340b is configured to provide the first supply voltage of voltage supply VDD to the sources/drains of an active region similar to active region 202b, and conductor 340a is configured to provide the second supply voltage of reference voltage supply VSS to the sources/drains of an active region similar to active region 202a.

In some embodiments, the set of conductors 340 is on the fourth layout level. Other layout levels for the set of conductors 340 are within the scope of the present disclosure.

Other configurations, arrangements on other layout levels or quantities of conductors in the set of conductors 340 are within the scope of the present disclosure.

Other materials, configurations, arrangements on other layout levels or quantities of elements in integrated circuit 300A are within the scope of the present disclosure.

In some embodiments, integrated circuit 300A achieves one or more of the benefits discussed above in at least FIGS. 1A-1B and 2A-2D, or discussed hereinafter.

FIG. 3B is a top view of an integrated circuit 300B, in accordance with some embodiments.

Integrated circuit 300B is manufactured by a corresponding layout design similar to integrated circuit 300B.

Integrated circuit 300B includes at least the set of gates 304, the set of contacts 306, a set of vias 311, the set of vias 312, the set of conductors 320 and the set of conductors 340.

Integrated circuit 300B is a variation of integrated circuit 300A (FIG. 3A), and similar detailed description is therefore omitted. For example, integrated circuit 300B illustrates an example of where the transistor T1-3b is configured as a diode-coupled transistor.

In comparison with integrated circuit 300A of FIG. 3A, a set of vias 311 of integrated circuit 300B replaces the set of vias 310 of FIG. 3A, and similar detailed description is therefore omitted.

The set of vias 311 includes at least via 310a or 310b. Other numbers of vias in the set of vias 311 are within the scope of the present disclosure.

In comparison with integrated circuit 300A of FIG. 3A, the set of vias 311 of integrated circuit 300B does not include via 310c, and similar detailed description is therefore omitted.

In some embodiments, by not including via 310c, the drain/source of transistor T1-3b and contact 206g are not electrically coupled to conductor 220g, and therefore transistor T1-3b is configured as a diode-coupled transistor where the gate 304b1 of transistor T1-3b and the drain/source of transistor T1-3b are electrically coupled together by at least conductors 220f and 220g.

Other materials, configurations, arrangements on other layout levels or quantities of elements in integrated circuit 300B are within the scope of the present disclosure.

In some embodiments, integrated circuit 300B achieves one or more of the benefits discussed above in at least FIGS. 1A-1B, 2A-2D or 3A or discussed hereinafter.

Figure 4A:
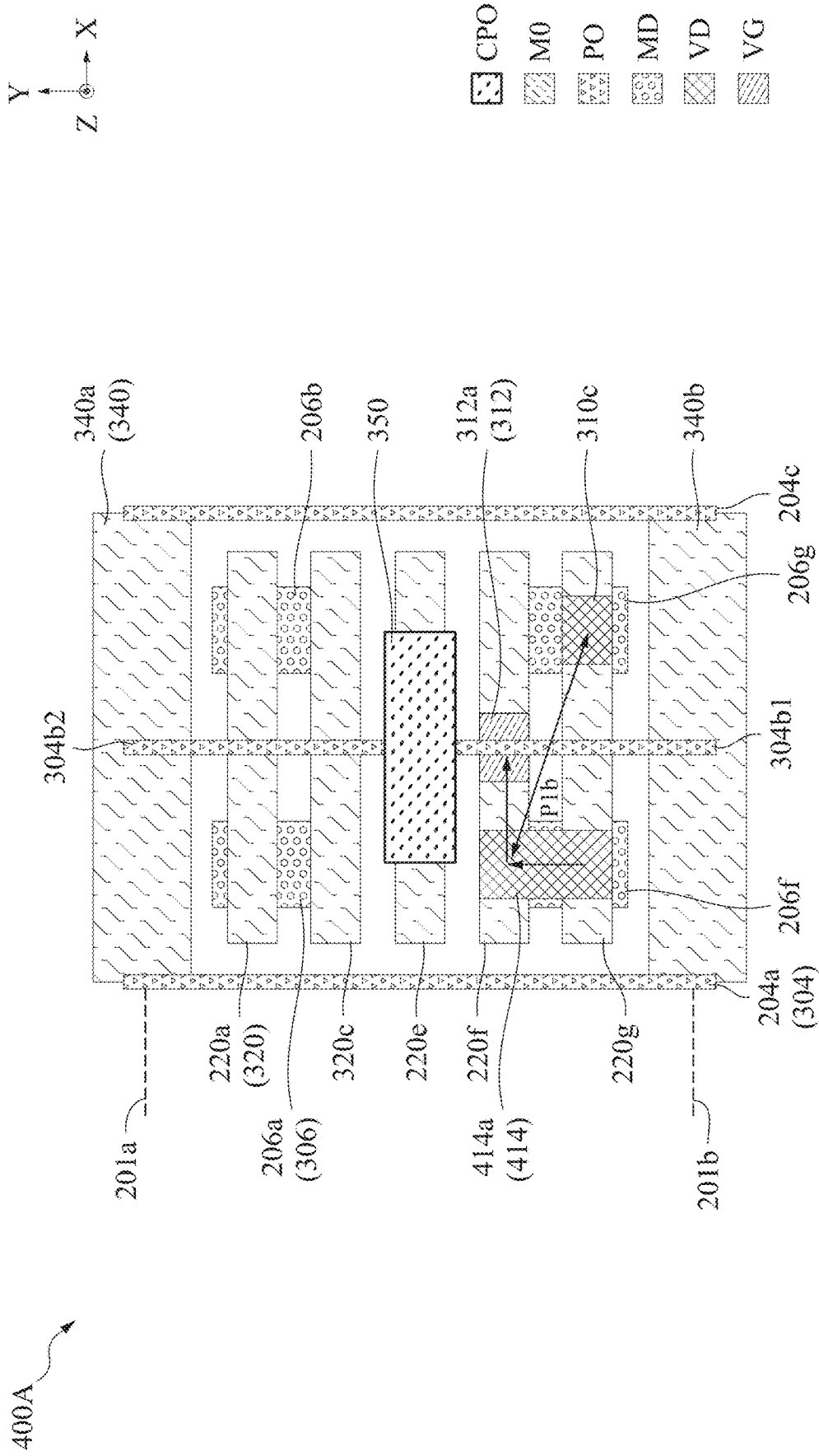
FIG. 4A is a top view of an integrated circuit, in accordance with some embodiments.

FIG. 4A is a top view of an integrated circuit 400A, in accordance with some embodiments.

Integrated circuit 400A is manufactured by a corresponding layout design similar to integrated circuit 400A.

Integrated circuit 400A includes at least the set of gates 304, the set of contacts 306, a set of vias 414, the set of vias 312, the set of conductors 320 and the set of conductors 340.

Integrated circuit 400A is a variation of integrated circuit 300A (FIG. 3A), and similar detailed description is therefore omitted. For example, integrated circuit 400A illustrates an example of where a slotted via (e.g., via 414a) replaces vias 310a and 310b.

In some embodiments, via 414a is similar to via 214a of FIG. 2B, and similar detailed description is therefore omitted.

In comparison with integrated circuit 300A of FIG. 3A, a set of vias 414 of integrated circuit 400A replaces the set of vias 310 of FIG. 3A, and similar detailed description is therefore omitted.

The set of vias 414 includes at least via 414a. Other numbers of vias in the set of vias 414 are within the scope of the present disclosure.

In some embodiments, the size of one or more vias in the set of vias 414 can be increased thereby reducing resistance compared to other approaches.

In some embodiments, by including via 414a, via 414a directly contacts the contact 206f over a larger surface area than approaches without via 414a, thereby reducing resistance and providing additional routing resources.

Other materials, configurations, arrangements on other layout levels or quantities of elements in integrated circuit 400A are within the scope of the present disclosure.

In some embodiments, integrated circuit 400A achieves one or more of the benefits discussed above in at least FIGS. 1A-1B, 2A-2D or 3A-3B or discussed hereinafter.

Figure 4B:
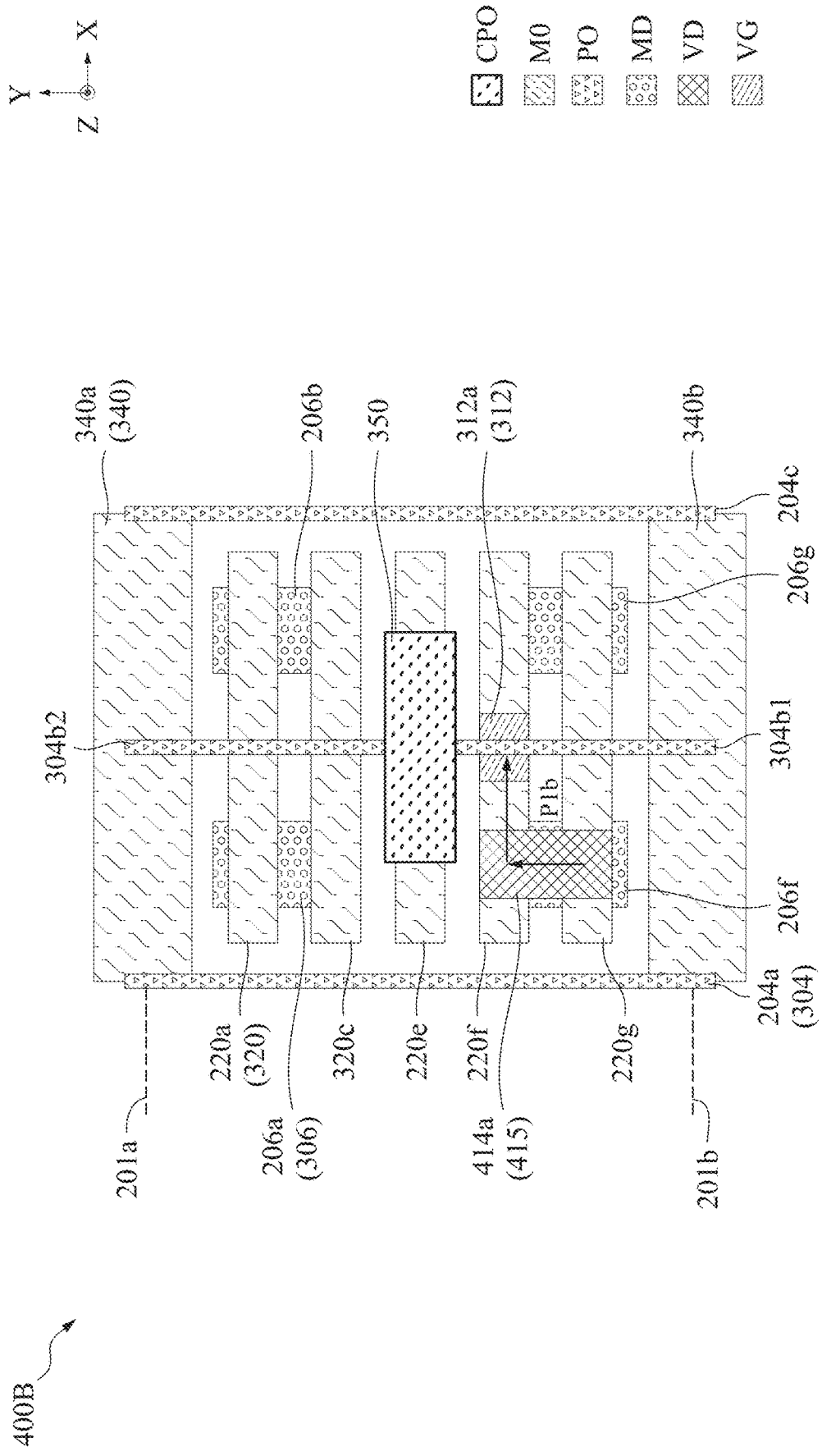
FIG. 4B is a top view of an integrated circuit, in accordance with some embodiments.

FIG. 4B is a top view of an integrated circuit 400B, in accordance with some embodiments.

Integrated circuit 400B is manufactured by a corresponding layout design similar to integrated circuit 400B.

Integrated circuit 400B includes at least the set of gates 304, the set of contacts 306, a set of vias 415, the set of vias 312, the set of conductors 320 and the set of conductors 340.

Integrated circuit 400B is a variation of integrated circuit 300A (FIG. 3A) or 400A (FIG. 4A), and similar detailed description is therefore omitted. For example, integrated circuit 400B illustrates an example of where the transistor T1-3b is configured as a diode-coupled transistor.

In comparison with integrated circuit 400A of FIG. 4A, a set of vias 415 of integrated circuit 400B replaces the set of vias 414 of FIG. 4A, and similar detailed description is therefore omitted.

The set of vias 415 includes at least via 415a. Other numbers of vias in the set of vias 415 are within the scope of the present disclosure.

In comparison with integrated circuit 400A of FIG. 4A, the set of vias 415 of integrated circuit 400B does not include via 310c, and similar detailed description is therefore omitted.

In some embodiments, by not including via 310c, the drain/source of transistor T1-3b and contact 206g are not electrically coupled to conductor 220g, and therefore transistor T1-3b is configured as a diode-coupled transistor where the gate 304b1 of transistor T1-3b and the drain/source of transistor T1-3b are electrically coupled together by at least conductors 220f and 220g.

In some embodiments, transistor T1-3a is not configured as a dummy transistor as in other approaches, thereby resulting in at least one of integrated circuit 300A, 300B, 400A or 400B having less capacitance and lower leakage current than other approaches.

In some embodiments, transistor T1-3a is configured as an antenna cell and is useable with one or more antennas or radiating elements.

Other materials, configurations, arrangements on other layout levels or quantities of elements in integrated circuit 400B are within the scope of the present disclosure.

In some embodiments, integrated circuit 400B achieves one or more of the benefits discussed above in at least FIGS. 1A-1B, 2A-2D or 3A or discussed hereinafter.

Figure 5A:
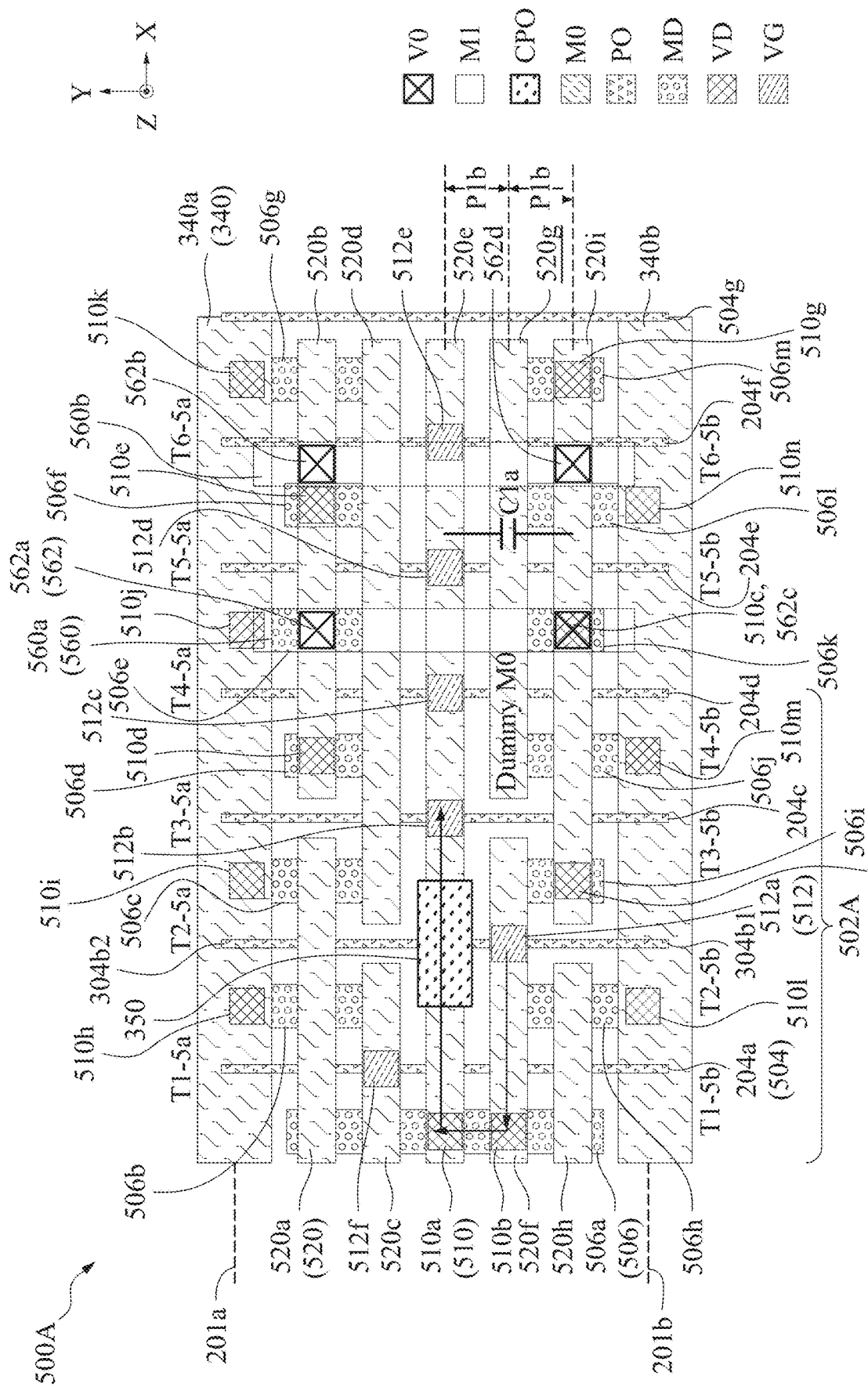
FIG. 5A is a top view of an integrated circuit, in accordance with some embodiments.

FIG. 5A is a top view of an integrated circuit 500A, in accordance with some embodiments.

Integrated circuit 500A is manufactured by a corresponding layout design similar to integrated circuit 500A.

Integrated circuit 500A includes at least a set of gates 504, a set of contacts 506, a set of vias 510, a set of vias 512, a set of conductors 520, the set of conductors 340, a set of vias 562 and a set of conductors 560.

Integrated circuit 500A is a variation of integrated circuit 200A (FIG. 2A), 300A (FIG. 3A) or 400A (FIG. 4A), and similar detailed description is therefore omitted.

In some embodiments, via 414a is similar to via 214a of FIG. 2B, and similar detailed description is therefore omitted.

In comparison with integrated circuit 200A of FIG. 2A, a set of gates 504 of integrated circuit 500A replaces the set of gates 204 of FIG. 2A or the set of gates 304 of FIG. 3A, a set of contacts 506 of integrated circuit 500A replaces the set of contacts 206 of FIG. 2A, a set of vias 510 of integrated circuit 500A replaces the set of vias 210 of FIG. 2A, a set of vias 512 of integrated circuit 500A replaces the set of vias 212 of FIG. 2A, and a set of conductors 520 of integrated circuit 500A replaces the set of conductors 220 of FIG. 2A, and similar detailed description is therefore omitted.

The set of gates 504 includes one or more of gates 204a, 304b1, 304b2, 204c, 204d, 204e, 204f or 504g.

In comparison with integrated circuit 200A of FIGS. 2A-2D, gate 504g is similar to at least gate 204a, 304b1, 304b2, 204c, 204d, 204e, 204f, and similar detailed description is therefore omitted.

In some embodiments, gate 204a is a gate of transistors T1-5a and T1-5b, gate 304b1 is a gate of transistor T2-5b, gate 304b2 is a gate of transistor T2-5a, gate 204c is a gate of transistors T3-5a and T3-5b, gate 204d is a gate of transistors T4-5a and T4-5b, gate 204e is a gate of transistors T5-5a and T5-5b, and gate 204f is a gate of transistors T6-5a and T6-5b of integrated circuits 500A-600B.

Other configurations, arrangements on other layout levels or quantities of gates in the set of gates 504 are within the scope of the present disclosure.

The set of contacts 506 includes at least contact 506a, . . . , 506l or 506m.

Contact 506a is electrically coupled to a source/drain of transistors T1-5a and T1-5b. Contact 506b is electrically coupled to a source/drain of transistors T1-5a and T2-5a. Contact 506c is electrically coupled to a source/drain of transistors T2-5a and T3-5a. Contact 506d is electrically coupled to a source/drain of transistors T3-5a and T4-5a. Contact 506e is electrically coupled to a source/drain of transistors T4-5a and T5-5a. Contact 506f is electrically coupled to a source/drain of transistors T5-5a and T6-5a. Contact 506g is electrically coupled to a source/drain of transistor T6-5a. Contact 506h is electrically coupled to a source/drain of transistors T1-5b and T2-5b. Contact 506i is electrically coupled to a source/drain of transistors T2-5b and T3-5b. Contact 506j is electrically coupled to a source/drain of transistors T3-5b and T4-5b. Contact 506k is electrically coupled to a source/drain of transistors T4-5b and T5-5b. Contact 506l is electrically coupled to a source/drain of transistors T5-5b and T6-5b. Contact 506m is electrically coupled to a source/drain of transistor T6-5b.

Other configurations, arrangements on other layout levels or quantities of contacts in the set of contacts 506 are within the scope of the present disclosure.

The set of vias 510 includes at least via 510a, 510b, . . . , 510m or 510n.

In comparison with integrated circuit 200A, at least via 510a or 510b replaces at least corresponding via 210a or 210b, and similar detailed description is therefore omitted. In comparison with integrated circuit 200A, at least one of via 510c, . . . , 510m or 510n is similar to at least via 210a or 210b, and similar detailed description is therefore omitted.

Via 510a is between conductor 520e and contact 506a. Via 510a is configured to electrically couple conductor 520e and contact 506a together. Conductor 520e is electrically coupled to the source/drain of transistors T1-5a and T1-5b by contact 506a and via 510a.

Via 510b is between conductor 520f and contact 506a. Via 510b is configured to electrically couple conductor 520f and contact 506a together. Conductor 520f is electrically coupled to the source/drain of transistors T1-5a and T1-5b by contact 506a and via 510b.

Via 510c is between conductor 520i and contact 506k. Via 510c is configured to electrically couple conductor 520i and contact 506k together. Conductor 520i is electrically coupled to the source/drain of transistors T4-5b and T5-5b by contact 506k and via 510c.

Via 510d is between conductor 520b and contact 506d. Via 510d is configured to electrically couple conductor 520b and contact 506d together. Conductor 520b is electrically coupled to the source/drain of transistors T3-5a and T4-5a by contact 506d and via 510d.

Vias 510h, 510i, 510j and 510k are between conductor 340a and corresponding contacts 506b, 505c, 506e and 506g.

Vias 510l, 510m and 510n are between conductor 340b and corresponding contacts 506h, 505j and 506l.

In some embodiments, at least the set of contacts 506 or the set of vias 510 are configured to electrically couple at least one conductor in the set of conductors 520 to at least another conductor in the set of conductors 520. For example, in some embodiments, contact 506a and vias 510a and 510b electrically couple conductors 520e and 520f to each other.

In some embodiments, via 510a and via 510c are separated from each other by pitch P1b.

Other configurations, arrangements on other layout levels or quantities of vias in the set of vias 510 are within the scope of the present disclosure.

The set of vias 512 includes at least via 512a, 512b, 512c, 512d, 512e or 512f.

In comparison with integrated circuit 200A, via 512a replaces via 212a, and similar detailed description is therefore omitted.

In some embodiments, at least via 512b, 512c, 512d, 512e or 512f is similar to via 212a, and similar detailed description is therefore omitted.

Via 512a is between conductor 520f and gate 304b1. Via 512a is configured to electrically couple conductor 520f and gate 304b1 together.

Via 512b is between conductor 520e and gate 204c. Via 512b is configured to electrically couple conductor 520e and gate 204c together.

Via 512c is between conductor 520e and gate 204d. Via 512c is configured to electrically couple conductor 520e and gate 204d together.

Via 512d is between conductor 520e and gate 204e. Via 512d is configured to electrically couple conductor 520e and gate 204e together.

Via 512e is between conductor 520e and gate 204f. Via 512e is configured to electrically couple conductor 520e and gate 204f together.

Via 512f is between conductor 520c and gate 204a. Via 512f is configured to electrically couple conductor 520c and gate 204a together.

Other configurations, arrangements on other layout levels or quantities of vias in the set of vias 512 are within the scope of the present disclosure.

The set of conductors 520 includes at least conductor 520a, 520b, . . . , 520h or 520i.

In comparison with integrated circuit 200A, conductor 520c replaces at least conductor 220c or 220d, and similar detailed description is therefore omitted.

Conductors 520e and 520f are electrically coupled to each other by at least contact 506a and vias 510a and 510b.

In some embodiments, gate 304b1 of transistor T2-5b, a drain/source of transistors T1-5a and T1-5b, gate 204c of transistors T3-5a and T3-5b, gate 204d of transistors T4-5a and T4-5b, gate 204e of transistors T5-5a and T5-5b and gate 204f of transistors T6-5a and T6-5b are electrically coupled together by at least conductors 520e and 520f. For example, in some embodiments, gate 304b1 is electrically coupled to conductor 520f by via 512a, and conductor 520f is electrically coupled to contact 506a by via 510b. Furthermore, contact 506a is electrically coupled to conductor 520e by via 510a, and conductor 520e is electrically coupled to gate 204c, 204d, 204e and 204f by corresponding vias 512b, 512c, 512d and 512e.

In some embodiments, conductor 520g is a dummy routing track. In some embodiments, a dummy routing track is not utilized to route signals. In some embodiments, a dummy routing track is electrically floating.

Conductor 520g is between conductor 520e and conductor 520i. In some embodiments, a parasitic capacitance C1a is formed between conductor 520e and conductor 520i. In some embodiments, by inserting a dummy routing track (e.g., conductor 520g) between conductor 520e and conductor 520i, a distance between conductor 520e and conductor 520i is increased thereby reducing the parasitic capacitance C1a resulting in improved performance in integrated circuit 500A-500B compared with other approaches that do not utilize vias 510a and 510b or via 514a that allow adjacent metal routing track to be coupled together.

Other configurations, arrangements on other layout levels or quantities of conductors in the set of conductors 520 are within the scope of the present disclosure.

The set of conductors 560 extend in at least the second direction Y.

The set of conductors 560 includes at least conductor 560a or 560b.

Each of conductors 560a or 560b of the set of conductors 560 are separated from each other in at least the second direction Y.

In some embodiments, while each of conductors 560a or 560b is shown as continuous patterns, one or more of conductors 560a or 560b is separated to form discontinuous patterns.

In some embodiments, the set of conductors 560 are located on the front-side (not labelled) of integrated circuit 500A-500B.

The set of conductors 560 overlap at least one or more of the set of gates 504, the set of contacts 506 or the set of conductors 520. In some embodiments, the set of conductors 560 is on a fifth layout level. In some embodiments, the fifth layout level is different from the first layout level, the second layout level, the third layout level and the fourth layout level. In some embodiments, the fifth layout level corresponds to the M1 level of one or more of layout design 100A-100B, or integrated circuit 200A-200B or 300A-700C. In some embodiments, the M1 level is above the OD level, the POLY level, the MD level, the VG level and the VD level and the M0 level. In some embodiments, the set of conductors 560 are located on other metal layers (e.g., metal-2 (M2), metal-3 (M3), etc.).

Each conductor in the set of conductors 560 is separated from an adjacent conductor in the set of conductors 560 in the second direction Y by a pitch (not labelled).

Other configurations, arrangements on other layout levels or quantities of conductors in the set of conductors 560 are within the scope of the present disclosure.

The set of vias 562 includes one or more of vias 562a, 562b, 562c or 562d. In some embodiments, the set of vias 562 are between the set of conductors 520 and the set of conductors 560. The set of vias 562 is embedded in insulating region 203. In some embodiments, the set of vias are located on the via-0 (V0) level of layout design 100A-100B, or integrated circuit 200A-200B or 300A-700C.

The set of vias 562 is located where the set of conductors 520 are overlapped by the set of conductors 560.

Via 562a or 562c is located where corresponding conductor 520b or 520i is overlapped by conductor 560a. Via 562b or 562d is located where corresponding conductor 520b or 520i is overlapped by conductor 560b.

The set of vias 562 is configured to electrically couple the set of conductors 520 and the set of conductors 560 together. In some embodiments, at least the set of conductors 560 or the set of vias 562 are configured to electrically couple at least one conductor in the set of conductors 520 to at least another conductor in the set of conductors 520. For example, in some embodiments, conductor 560a is electrically coupled to each of vias 562a and 562c, and at least via 562a or 562c is electrically coupled to corresponding conductors 520b and 520i. For example, in some embodiments, conductor 560b is electrically coupled to each of vias 562b and 562d, and at least via 562b or 562d is electrically coupled to corresponding conductors 520b and 520i.

Other materials, configurations, arrangements on other layout levels or quantities of elements in integrated circuit 500A are within the scope of the present disclosure.

In some embodiments, integrated circuit 500A achieves one or more of the benefits discussed above in at least FIGS. 1A-1B, 2A-2D, 3A-3B or 4A-4B or discussed hereinafter.

Figure 5B:
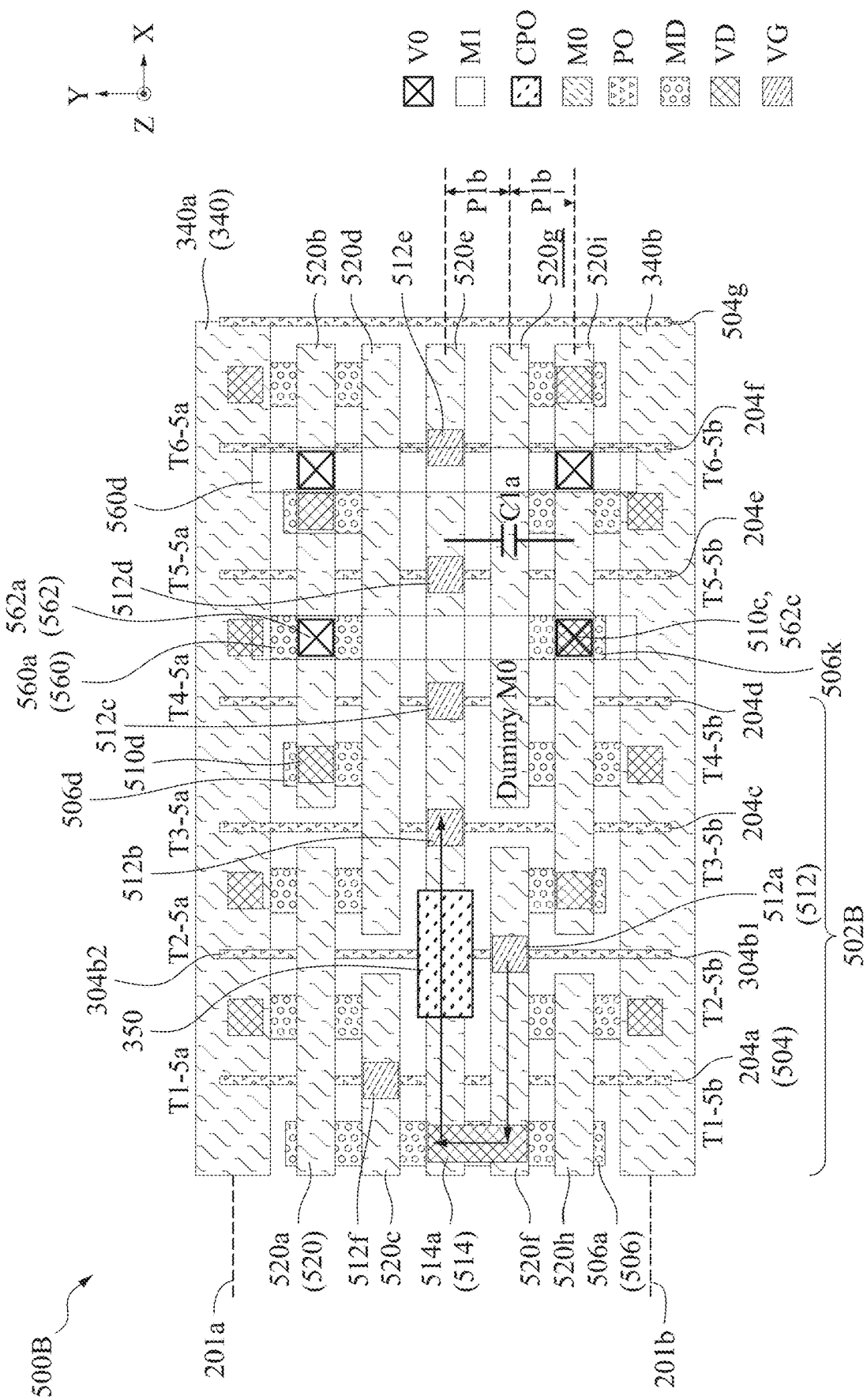
FIG. 5B is a top view of an integrated circuit, in accordance with some embodiments.

FIG. 5B is a top view of an integrated circuit 500B, in accordance with some embodiments.

Integrated circuit 500B is manufactured by a corresponding layout design similar to integrated circuit 500B.

Integrated circuit 500B includes at least the set of gates 504, the set of contacts 506, a set of vias 514, the set of vias 512, the set of conductors 520, the set of conductors 340, the set of vias 562 and the set of conductors 560.

Integrated circuit 500B is a variation of integrated circuit 500A (FIG. 5A), and similar detailed description is therefore omitted. For example, integrated circuit 500B illustrates an example of where a slotted via (e.g., via 514a) replaces vias 510a and 510b.

In some embodiments, via 514a is similar to via 214a of FIG. 2B or via 414a of FIGS. 4A-4B, and similar detailed description is therefore omitted.

In comparison with integrated circuit 500A of FIG. 5A, a set of vias 514 of integrated circuit 500B replaces the set of vias 510 of FIG. 5A, and similar detailed description is therefore omitted.

The set of vias 514 includes at least via 514a, 510c, . . . , 510m or 510n. Other numbers of vias in the set of vias 514 are within the scope of the present disclosure.

In some embodiments, the size of one or more vias in the set of vias 514 can be increased thereby reducing resistance compared to other approaches.

In some embodiments, by including via 514a, via 514a directly contacts the contact 506a over a larger surface area than approaches without via 514a, thereby reducing resistance and providing additional routing resources.

Other materials, configurations, arrangements on other layout levels or quantities of elements in integrated circuit 500B are within the scope of the present disclosure.

In some embodiments, integrated circuit 500B achieves one or more of the benefits discussed above in at least FIGS. 1A-1B, 2A-2D, 3A-3B, 4A-4B or 5A or discussed hereinafter.

Figure 6A:
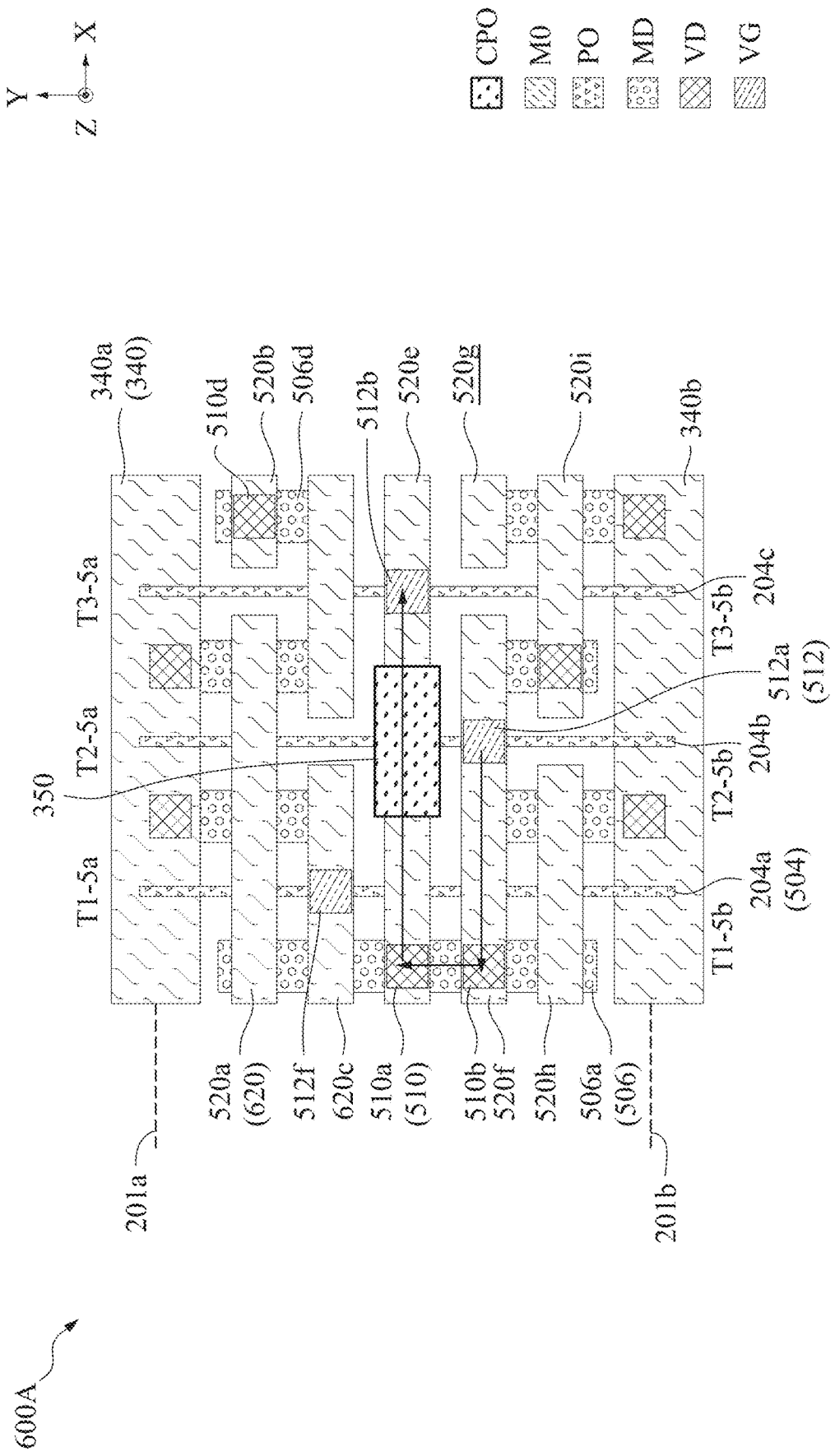
FIG. 6A is a top view of an integrated circuit, in accordance with some embodiments.

FIG. 6A is a top view of an integrated circuit 600A, in accordance with some embodiments.

Integrated circuit 600A is manufactured by a corresponding layout design similar to integrated circuit 600A.

Integrated circuit 600A includes at least the set of gates 504, the set of contacts 506, the set of vias 510, the set of vias 512, a set of conductors 620, the set of conductors 340, the set of vias 562 and the set of conductors 560.

Integrated circuit 600A is a variation of integrated circuit 500A (FIG. 5A), and similar detailed description is therefore omitted. For example, integrated circuit 600A corresponds to a region 502A from integrated circuit 500A in FIG. 5A.

In comparison with region 502A from integrated circuit 500A of FIG. 5A, a set of conductors 620 of integrated circuit 600A replaces the set of conductors 520 of FIG. 5A, and similar detailed description is therefore omitted.

The set of conductors 620 includes at least conductor 520a, 520b, 620c, 520e, . . . , 520h or 520i. Other numbers of conductors in the set of conductors 620 are within the scope of the present disclosure.

In comparison with integrated circuit 500A, conductor 620c replaces conductors 520c and 520d, and similar detailed description is therefore omitted.

Via 512f is between conductor 620c and gate 204a. Via 512f is configured to electrically couple conductor 620c and gate 204a together.

Other materials, configurations, arrangements on other layout levels or quantities of elements in integrated circuit 600A are within the scope of the present disclosure.

In some embodiments, integrated circuit 600A achieves one or more of the benefits discussed above in at least FIGS. 1A-1B, 2A-2D, 3A-3B, 4A-4B or 5A-5B or discussed hereinafter.

Figure 6B:
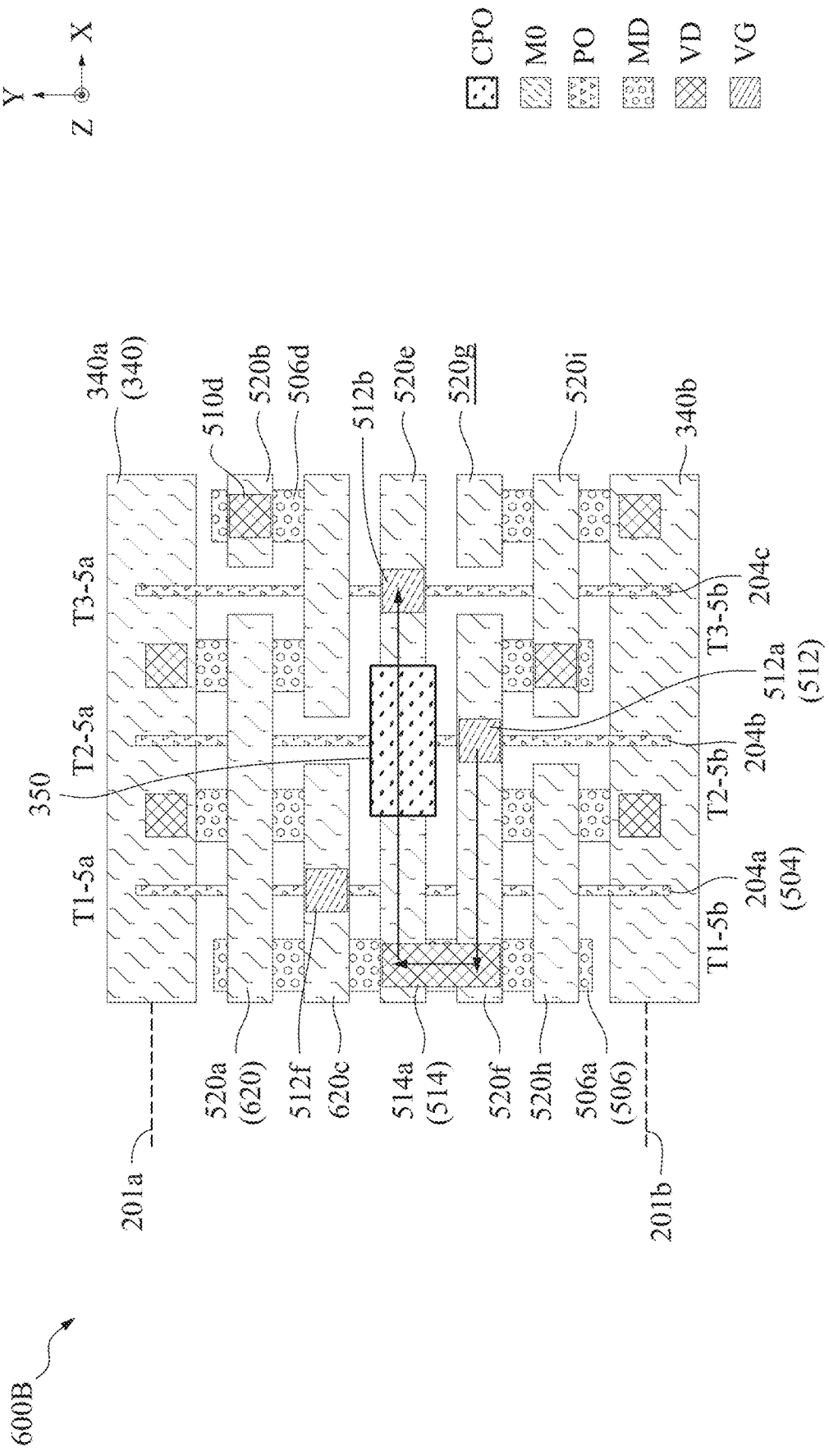
FIG. 6B is a top view of an integrated circuit, in accordance with some embodiments.

FIG. 6B is a top view of an integrated circuit 600B, in accordance with some embodiments.

Integrated circuit 600B is manufactured by a corresponding layout design similar to integrated circuit 600B.

Integrated circuit 600B includes at least the set of gates 504, the set of contacts 506, the set of vias 514, the set of vias 512, a set of conductors 620, the set of conductors 340, the set of vias 562 and the set of conductors 560.

Integrated circuit 600B is a variation of integrated circuit 500B (FIG. 5B) or integrated circuit 600A (FIG. 6A), and similar detailed description is therefore omitted. For example, integrated circuit 600B corresponds to a region 502B from integrated circuit 500B in FIG. 5B.

In comparison with region 502B from integrated circuit 500B of FIG. 5B, the set of conductors 620 of integrated circuit 600B replaces the set of conductors 520 of FIG. 5B, and similar detailed description is therefore omitted.

Other materials, configurations, arrangements on other layout levels or quantities of elements in integrated circuit 600B are within the scope of the present disclosure.

In some embodiments, integrated circuit 600B achieves one or more of the benefits discussed above in at least FIGS. 1A-1B, 2A-2D, 3A-3B, 4A-4B, 5A-5B or 6A or discussed hereinafter.

Figure 7A:
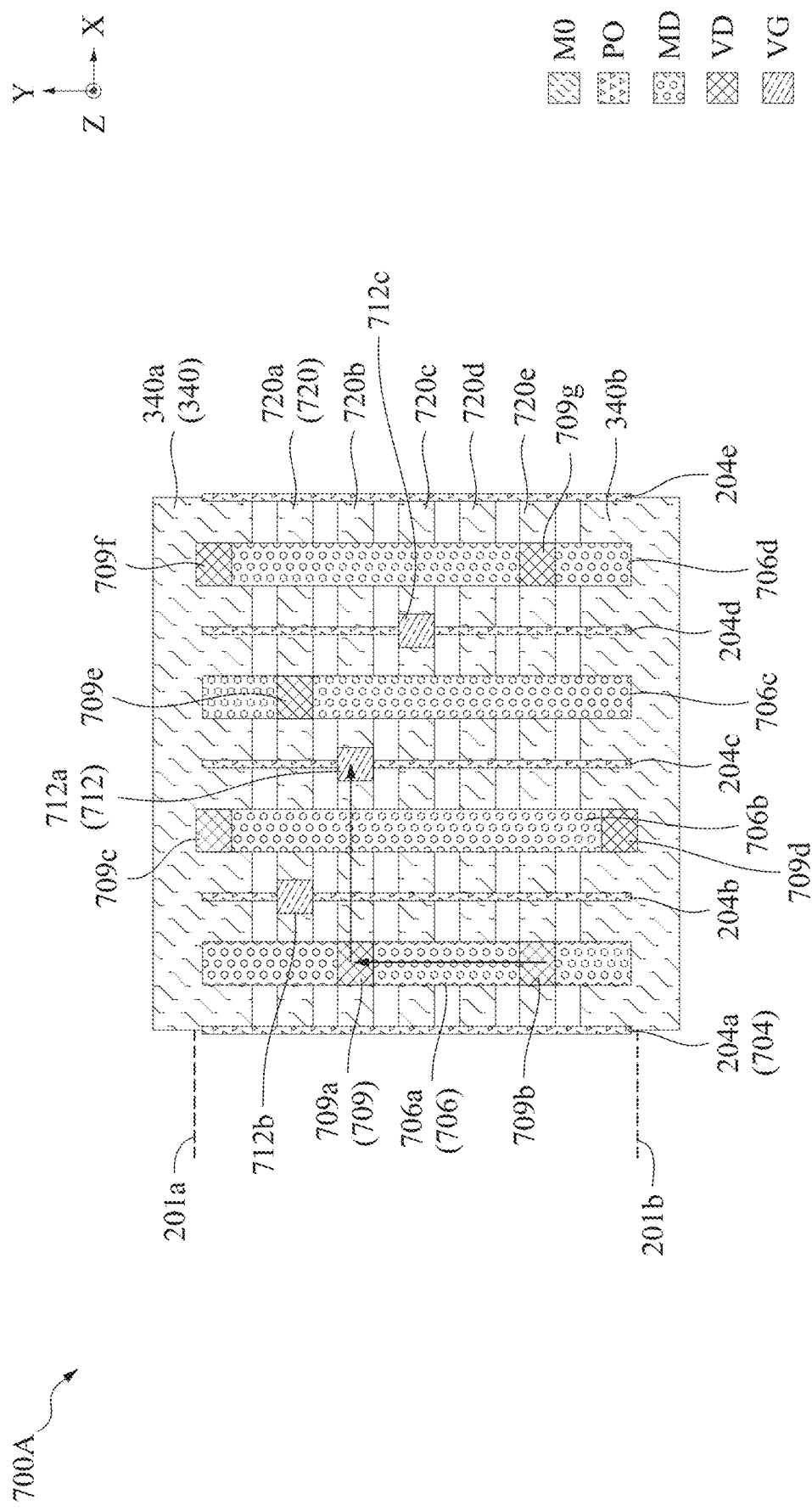
FIG. 7A is a top view of an integrated circuit, in accordance with some embodiments.

FIG. 7A is a top view of an integrated circuit 700A, in accordance with some embodiments.

Integrated circuit 700A is manufactured by a corresponding layout design similar to integrated circuit 700A.

Integrated circuit 700A includes at least a set of gates 704, a set of contacts 706, a set of vias 709, a set of vias 712, a set of conductors 720 and the set of conductors 340.

Integrated circuit 700A is a variation of integrated circuit 200A (FIG. 2A), 300A (FIG. 3A) 400A (FIG. 4A), 500A (FIG. 5A) or 600A (FIG. 6A), and similar detailed description is therefore omitted.

In comparison with integrated circuit 200A of FIG. 2A, a set of gates 704 of integrated circuit 700A replaces the set of gates 204 of FIG. 2A or the set of gates 304 of FIG. 3A, a set of contacts 706 of integrated circuit 700A replaces the set of contacts 206 of FIG. 2A, a set of vias 709 of integrated circuit 700A replaces the set of vias 210 of FIG. 2A, a set of vias 712 of integrated circuit 700A replaces the set of vias 212 of FIG. 2A, and a set of conductors 720 of integrated circuit 700A replaces the set of conductors 220 of FIG. 2A, and similar detailed description is therefore omitted.

The set of gates 704 includes one or more of gates 204a, 204b, 204c, 204d or 204e.

Other configurations, arrangements on other layout levels or quantities of gates in the set of gates 704 are within the scope of the present disclosure.

The set of contacts 706 includes at least contact 706a, 706b, 706c or 706d.

Figure 7B:
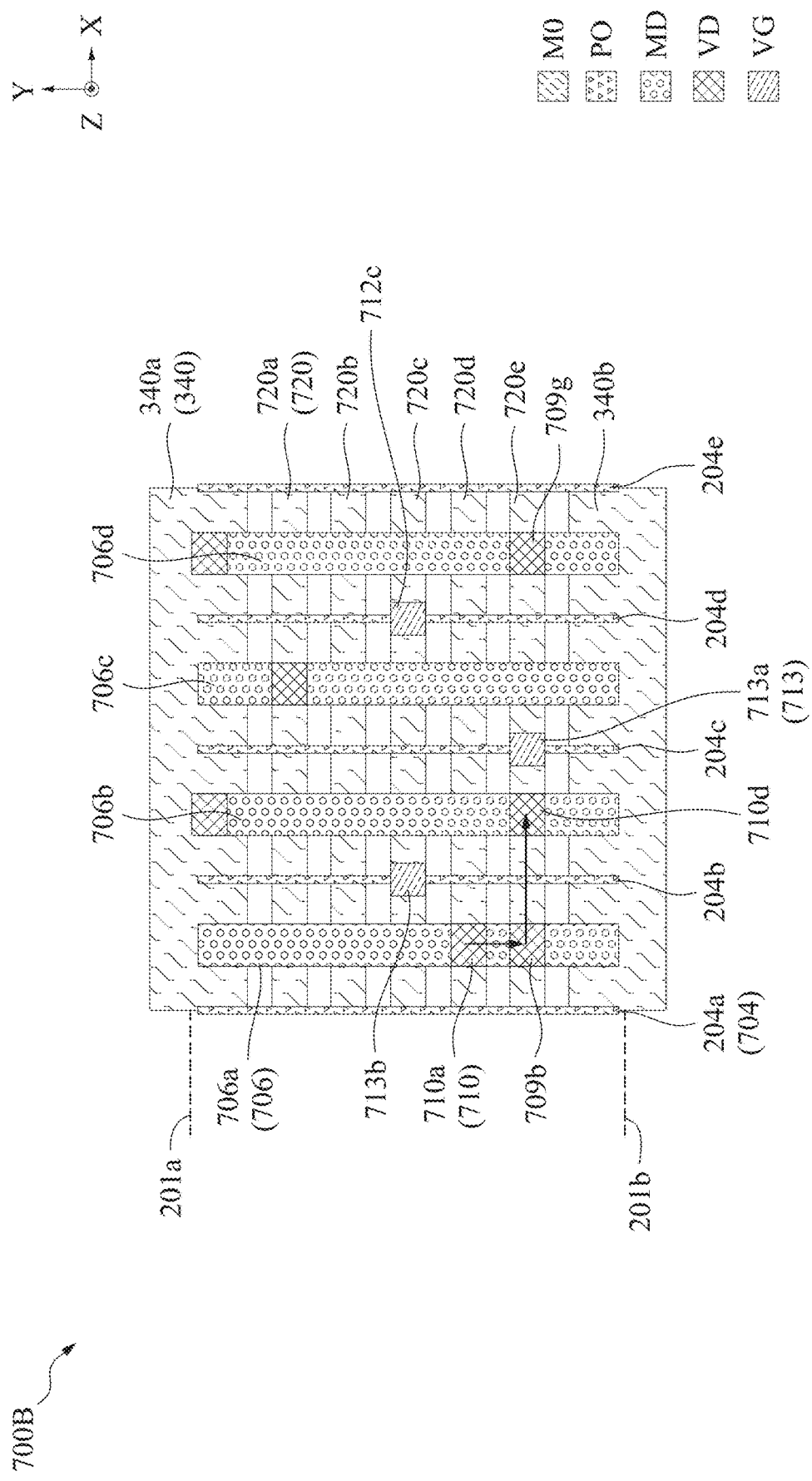
FIG. 7B is a top view of an integrated circuit, in accordance with some embodiments.
Figure 7C:
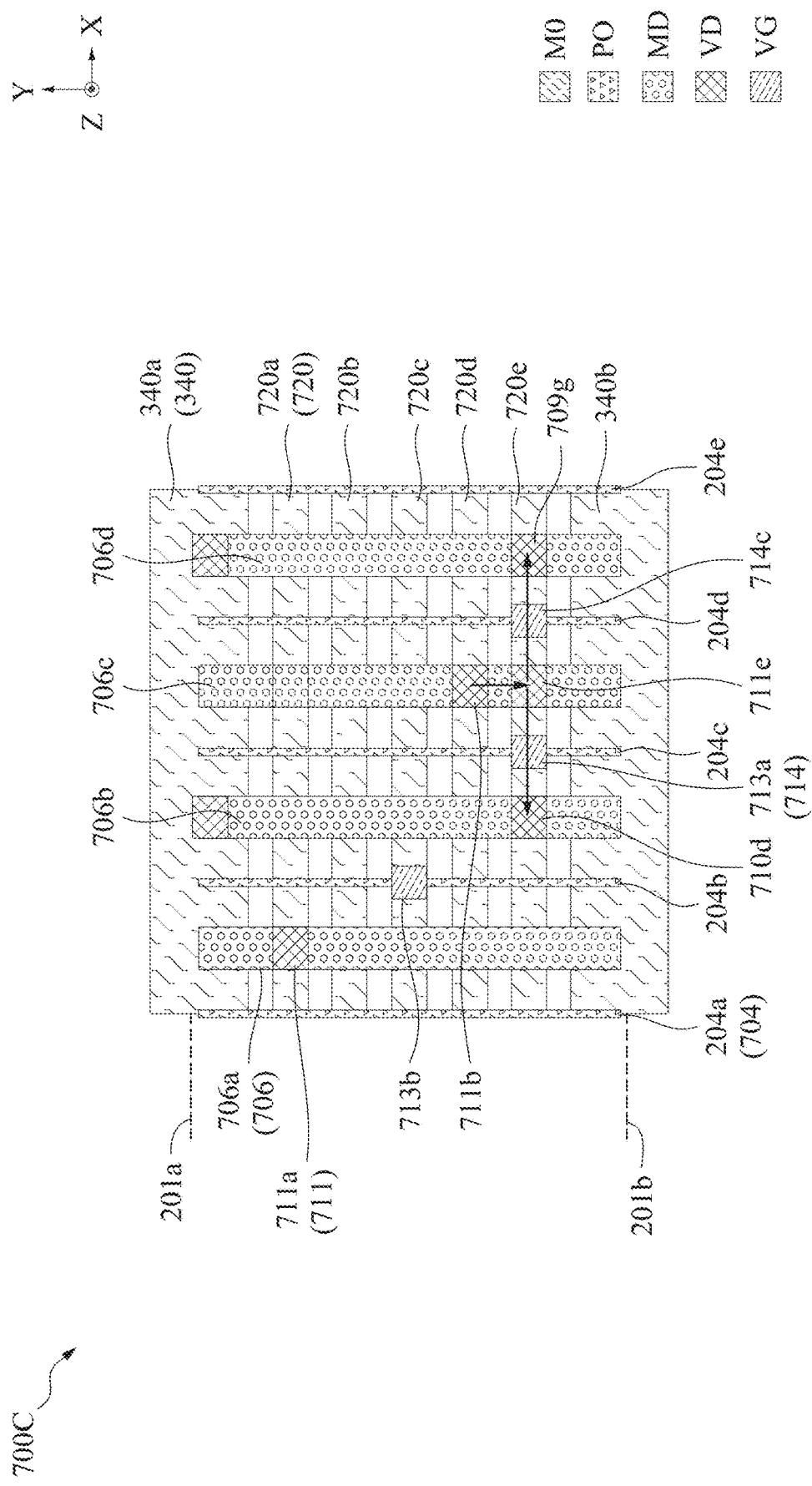
FIG. 7C is a top view of an integrated circuit, in accordance with some embodiments.

The set of contacts 706 extend across 5 M0 routing tracks in FIGS. 7A-7C. In some embodiments, one or more contacts in the set of contacts 706 extend across other number of M0 routing tracks.

Other configurations, arrangements on other layout levels or quantities of contacts in the set of contacts 706 are within the scope of the present disclosure.

The set of vias 709 includes at least via 709a, 709b, . . . , 709f or 709g.

In comparison with integrated circuit 200A, at least via 709a or 709b replaces at least corresponding via 210a or 210b, and similar detailed description is therefore omitted. In comparison with integrated circuit 200A, at least one of via 709c, . . . , 709f or 709g is similar to at least via 210a or 210b, and similar detailed description is therefore omitted.

Via 709a is between conductor 720b and contact 706a. Via 709a is configured to electrically couple conductor 720b and contact 706a together. Conductor 720b is electrically coupled to the source/drain of one or more transistors by contact 706a and via 709a.

Via 709b is between conductor 720e and contact 706a. Via 709b is configured to electrically couple conductor 720e and contact 706a together. Conductor 720e is electrically coupled to the source/drain of one or more transistors by contact 706a and via 709b.

Vias 709c and 709d are between corresponding conductor 340a and 340b and contact 706b.

Via 709e is between conductor 720a and contact 706c.

Via 709f is between conductor 340a and contact 706d.

Via 709g is between conductor 720e and contact 706d.

In some embodiments, at least the set of contacts 706 or the set of vias 709 are configured to electrically couple at least one conductor in the set of conductors 720 to at least another conductor in the set of conductors 720. For example, in some embodiments, contact 706a and vias 709a and 709b electrically couple conductors 720b and 720e to each other.

As shown in FIG. 7A, contact 706a and vias 709a and 709b electrically couple conductors 720b and 720e that are separated from each other by at least 3 M0 routing tracks. Other positions for vias 709a and 709b are within the scope of the present disclosure. For example, in some embodiments, contact 706a and vias 709a and 709b electrically couple conductors that are separated from each other by at least 4 M0 routing tracks. For example, in some embodiments, contact 706a and vias 709a and 709b electrically couple conductors that are separated from each other by at least 1 M0 routing track.

Other configurations, arrangements on other layout levels or quantities of vias in the set of vias 709 are within the scope of the present disclosure.

The set of vias 712 includes at least via 712a, 712b or 712c.

In comparison with integrated circuit 200A, via 712a replaces via 212a, and similar detailed description is therefore omitted.

In some embodiments, at least via 712b or 712c is similar to via 212a, and similar detailed description is therefore omitted.

Via 712a is between conductor 720b and gate 204c. Via 712a is configured to electrically couple conductor 720b and gate 204c together.

Via 712b is between conductor 720a and gate 204b. Via 712b is configured to electrically couple conductor 720a and gate 204b together.

Via 712c is between conductor 720c and gate 204d. Via 712c is configured to electrically couple conductor 720c and gate 204d together.

Other configurations, arrangements on other layout levels or quantities of vias in the set of vias 712 are within the scope of the present disclosure.

The set of conductors 720 includes at least conductor 720a, 720b, . . . , 720d or 720e.

In comparison with integrated circuit 200A, at least conductor 720a, 720b, . . . , 720d or 720e replaces at least corresponding conductor 220a, 220c, 220e, 220f or 220g, and similar detailed description is therefore omitted.

Conductors 720b and 720e are electrically coupled to each other by at least contact 706a and vias 709a and 709b.

Other configurations, arrangements on other layout levels or quantities of conductors in the set of conductors 720 are within the scope of the present disclosure.

Other materials, configurations, arrangements on other layout levels or quantities of elements in integrated circuit 700A are within the scope of the present disclosure.

In some embodiments, integrated circuit 700A achieves one or more of the benefits discussed above in at least FIGS. 1A-1B, 2A-2D, 3A-3B, 4A-4B, 5A-5B or 6A-6B or discussed hereinafter.

FIG. 7B is a top view of an integrated circuit 700B, in accordance with some embodiments.

Integrated circuit 700B is manufactured by a corresponding layout design similar to integrated circuit 700B.

Integrated circuit 700B includes at least a set of gates 704, a set of contacts 706, a set of vias 709, a set of vias 710, a set of vias 713, a set of conductors 720 and the set of conductors 340.

Integrated circuit 700B is a variation of integrated circuit 200A (FIG. 2A), 300A (FIG. 3A) 400A (FIG. 4A), 500A (FIG. 5A), 600A (FIG. 6A) or 700A (FIG. 7A), and similar detailed description is therefore omitted. For example, integrated circuit 700B illustrates an example of where via 710a, via 709b and via 710d are arranged in an L-shape.

In comparison with integrated circuit 700A of FIG. 7A, a set of vias 710 of integrated circuit 700B replaces the set of vias 709 of FIG. 7A, and a set of vias 713 of integrated circuit 700B replaces the set of vias 712 of FIG. 7A, and similar detailed description is therefore omitted.

The set of vias 709 includes at least via 710a, 709b, 709c, 710d, 709e, 709f or 709g.

In comparison with integrated circuit 700A, at least via 710a or 710d replaces at least corresponding via 709a or 709d, and similar detailed description is therefore omitted.

Via 710a is between conductor 720d and contact 706a. Via 710a is configured to electrically couple conductor 720d and contact 706a together. Conductor 720d is electrically coupled to the source/drain of one or more transistors by contact 706a and via 710a.

Via 710d is between conductor 720e and contact 706b. Via 710d is configured to electrically couple conductor 720e and contact 706b together. Conductor 720e is electrically coupled to the source/drain of one or more transistors by contact 706b and via 710d.

In some embodiments, via 710a, via 709b and via 710d are arranged in an L-shape. In some embodiments, one or more positions of via 710a, via 709b or via 710d can be changed provided that via 710a, via 709b or via 710d are arranged in the L-shape or an inverted L-shape.

In some embodiments, at least the set of contacts 706 or the set of vias 710 are configured to electrically couple at least one conductor in the set of conductors 720 to at least another conductor in the set of conductors 720. For example, in some embodiments, contact 706a and vias 710a and 709b electrically couple conductors 720d and 720e to each other.

Other configurations, arrangements on other layout levels or quantities of vias in the set of vias 709 are within the scope of the present disclosure.

The set of vias 713 includes at least via 713a, 713b or 712c.

In comparison with integrated circuit 700A, via 713a replaces via 712a, and via 713b replaces via 712b and similar detailed description is therefore omitted.

Via 713a is between conductor 720e and gate 204c. Via 713a is configured to electrically couple conductor 720e and gate 204c together.

Via 713b is between conductor 720c and gate 204b. Via 713b is configured to electrically couple conductor 720c and gate 204b together.

Other configurations, arrangements on other layout levels or quantities of vias in the set of vias 713 are within the scope of the present disclosure.

Conductors 720d and 720e are electrically coupled to each other by at least contact 706a and vias 710a and 709b.

Other configurations, arrangements on other layout levels or quantities of conductors in the set of conductors 720 are within the scope of the present disclosure.

Other materials, configurations, arrangements on other layout levels or quantities of elements in integrated circuit 700B are within the scope of the present disclosure.

In some embodiments, integrated circuit 700B achieves one or more of the benefits discussed above in at least FIGS. 1A-1B, 2A-2D, 3A-3B, 4A-4B, 5A-5B, 6A-6B or 7A or discussed hereinafter.

FIG. 7C is a top view of an integrated circuit 700C, in accordance with some embodiments.

Integrated circuit 700C is manufactured by a corresponding layout design similar to integrated circuit 700C.

Integrated circuit 700C includes at least a set of gates 704, a set of contacts 706, a set of vias 711, a set of vias 714, a set of conductors 720 and the set of conductors 340.

Integrated circuit 700C is a variation of integrated circuit 200A (FIG. 2A), 300A (FIG. 3A) 400A (FIG. 4A), 500A (FIG. 5A), 600A (FIG. 6A), 700A (FIG. 7A) or 700B (FIG. 7B), and similar detailed description is therefore omitted.

In comparison with integrated circuit 700B of FIG. 7B, a set of vias 711 of integrated circuit 700C replaces the set of vias 710 of FIG. 7B, and a set of vias 714 of integrated circuit 700C replaces the set of vias 713 of FIG. 7B, and similar detailed description is therefore omitted. For example, integrated circuit 700B illustrates an example of where via 711b, 710d, via 711e and 709g are arranged in an inverted T-shape.

The set of vias 711 includes at least via 711a, 711b, 709c, 710d, 711e, 709f or 709g.

In comparison with integrated circuits 700A-700B, at least via 711a, 711b or 711e replaces at least corresponding via 710a, 709b or 709e, and similar detailed description is therefore omitted.

Via 711a is between conductor 720a and contact 706a. Via 711a is configured to electrically couple conductor 720a and contact 706a together. Conductor 720a is electrically coupled to the source/drain of one or more transistors by contact 706a and via 711a.

Via 711b is between conductor 720d and contact 706c. Via 711b is configured to electrically couple conductor 720d and contact 706c together. Conductor 720d is electrically coupled to the source/drain of one or more transistors by contact 706c and via 711b.

Via 711e is between conductor 720e and contact 706c. Via 711e is configured to electrically couple conductor 720e and contact 706c together. Conductor 720e is electrically coupled to the source/drain of one or more transistors by contact 706c and via 711e.

In some embodiments, via 711b, 710d, via 711e and 709g are arranged in an inverted T-shape. In some embodiments, one or more positions of 711b, 710d, via 711e and 709g can be changed provided that 711b, 710d, via 711e and 709g are arranged an inverted T-shape or a T-shape.

In some embodiments, at least the set of contacts 706 or the set of vias 711 are configured to electrically couple at least one conductor in the set of conductors 720 to at least another conductor in the set of conductors 720. For example, in some embodiments, contact 706c and vias 711b and 711e electrically couple conductors 720d and 720e to each other.

Other configurations, arrangements on other layout levels or quantities of vias in the set of vias 711 are within the scope of the present disclosure.

The set of vias 714 includes at least via 713a, 713b or 714c.

In comparison with integrated circuit 700B, via 714c replaces via 712c, and similar detailed description is therefore omitted.

Via 714c is between conductor 720e and gate 204d. Via 714c is configured to electrically couple conductor 720e and gate 204d together.

Other configurations, arrangements on other layout levels or quantities of vias in the set of vias 714 are within the scope of the present disclosure.

Conductors 720d and 720e are electrically coupled to each other by at least contact 706c and vias 711b and 711e.

Other configurations, arrangements on other layout levels or quantities of conductors in the set of conductors 720 are within the scope of the present disclosure.

Other materials, configurations, arrangements on other layout levels or quantities of elements in integrated circuit 700C are within the scope of the present disclosure.

In some embodiments, integrated circuit 700C achieves one or more of the benefits discussed above in at least FIGS. 1A-1B, 2A-2D, 3A-3B, 4A-4B, 5A-5B, 6A-6B or 7A-7B or discussed hereinafter.

FIG. 8 is a functional flow chart of a method of manufacturing an IC device, in accordance with some embodiments. It is understood that additional operations may be performed before, during, and/or after the method 800 depicted in FIG. 8, and that some other processes may only be briefly described herein.

In some embodiments, other order of operations of method 800 is within the scope of the present disclosure. Method 800 includes exemplary operations, but the operations are not necessarily performed in the order shown. Operations may be combined, divided, added, replaced, changed order, and/or eliminated as appropriate, in accordance with the spirit and scope of disclosed embodiments.

In some embodiments, one or more of the operations of at least method 800, 900 or 1000 is not performed.

In some embodiments, method 800 is an embodiment of operations 904 and 906 of method 900. In some embodiments, the method 800 is usable to manufacture or fabricate at least integrated circuit 200A-200B, 300A-300B, 400A-400B, 500A-500B, 600A-600B or 700A-700C, or an integrated circuit with similar features as at least layout design 100A-100B.

In some embodiments, other order of operations of methods 800 are within the scope of the present disclosure. Method 800 includes exemplary operations, but the operations are not necessarily performed in the order shown. Operations may be added, replaced, changed order, and/or eliminated as appropriate, in accordance with the spirit and scope of disclosed embodiments.

In operation 802 of method 800, a set of active regions 202 of a set of transistors is formed in a front-side of a substrate 290. In some embodiments, the set of transistors of method 800 includes one or more transistors in the set of active regions 202. In some embodiments, the set of transistors of method 800 includes one or more transistors described herein.

In some embodiments, operation 802 further includes at least operation 802a. In some embodiments, operation 802a (not shown) includes fabricating source and drain regions of the set of transistors in a first well. In some embodiments, the first well comprises p-type dopants. In some embodiments, the p-dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1 \times 10^{12}$ atoms/cm$^3$ to $1 \times 10^{14}$ atoms/cm$^3$. Other dopant concentrations are in the scope of the present disclosure.

In some embodiments, the first well comprises n-type dopants. In some embodiments, the n-type dopants include phosphorus, arsenic or other suitable n-type dopants. In some embodiments, the n-type dopant concentration ranges from about $1 \times 10^{12}$ atoms/cm$^2$ to about $1 \times 10^{14}$ atoms/cm$^2$. Other dopant concentrations are in the scope of the present disclosure.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In operation 804 of method 800, a first conductive material is deposited over source/drain regions of the set of transistors on a first level thereby forming a first set of contacts of the set of transistors. In some embodiments, the first level of method 800 includes the MD level or the POLY level.

In some embodiments, the source/drain regions of the set of transistors of method 800 includes the source/drain regions of one or more transistors in the set of active regions 202. In some embodiments, the set of contacts of method 800 include at least the set of contacts 206, 306, 506 or 706. In some embodiments, the set of contacts of method 800 includes features in the MD level.

In operation 806 of method 800, a set of gates of the set of transistors is formed on the second level. In some embodiments, the set of gates of method 800 includes gate regions that include the set of gates 204, 304, 504 or 704. In some embodiments, the second level of method 800 includes the POLY level.

In some embodiments, the gate region is between the drain region and the source region. In some embodiments, the gate region is over the first well and the substrate. In some embodiments, fabricating the gate regions of operation 806 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 808 of method 800, a cut process is performed to remove portions of the set of gates. In some embodiments, the removed portions of the set of gates of method 800 includes features similar to at least the removed gate portions 350 of gate structure 304b1 and 304b2. In some embodiments, the removed portions of the set of gates of method 800 includes features in the POLY level.

In some embodiments, further details of operation 808 are described in operation 906 of method 900 (FIG. 9).

In operation 810 of method 800, a first set of vias and a second set of vias are formed.

In some embodiments, the first set of vias of method 800 are in the VD. In some embodiments, the first set of vias of method 800 includes at least the set of vias 210, 214, 310, 311, 414, 415, 510, 514, 709, 710 or 711.

In some embodiments, operation 810 is performed by a first VD mask. In some embodiments, operation 810 is performed by a first VD mask, a second VD mask different from the first VD mask.

In some embodiments, the second set of vias of method 800 are in the VG level. In some embodiments, the second set of vias of method 800 includes at least the set of vias 212, 312, 512, 712, 713 or 714.

In some embodiments, the first set of vias are formed over the first set of contacts. In some embodiments, the second set of vias are formed over the set of gates.

In some embodiments, operation 810 includes forming a first and second set of self-aligned contacts (SACs) in the insulating layer over the front-side of the wafer. In some embodiments, the first and second set of vias are electrically coupled to at least the set of transistors.

In operation 812 of method 800, a second conductive material is deposited on a third level thereby forming a first set of power rails and a first set of signal lines. In some embodiments, the third level of method 800 includes the M0 layer. In some embodiments, operation 814 includes at least depositing a first set of conductive regions over the front-side of the integrated circuit.

In some embodiments, the first set of power rails of method 800 includes one or more portions of at least the set of conductors 340.

In some embodiments, the first set of signal lines of method 800 includes one or more portions of at least the set of conductors 220, 320, 520, 620 or 720.

In some embodiments, the first set of power rails is electrically coupled to at least the first set of contacts or the second set of contacts by the first set of vias. In some embodiments, the first set of signal lines is electrically coupled to at least the set of gates by the second set of vias.

In operation 814 of method 800, a third set of vias are formed. In some embodiments, the third set of vias of method 800 are in the V0 level. In some embodiments, the third set of vias of method 800 includes at least the set of vias 562. In some embodiments, the third set of vias are formed over at least the first set of signal lines.

In some embodiments, operation 814 includes forming a first set of self-aligned contacts (SACs) in the insulating layer over the front-side of the wafer. In some embodiments, the third set of vias is electrically coupled to at least the set of transistors.

In operation 816 of method 800, a third conductive material is deposited on a fourth level thereby forming a first set of conductors. In some embodiments, the fourth level of method 800 includes the M1 layer. In some embodiments, the first set of conductors of method 800 includes one or more portions of at least the set of conductors 560. In some embodiments, the first set of conductors of method 800 includes one or more conductors similar to at least conductors in the M1 layer.

In some embodiments, one or more of operations 804, 806, 808, 810, 812, 814 or 816 of method 800 include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 12:
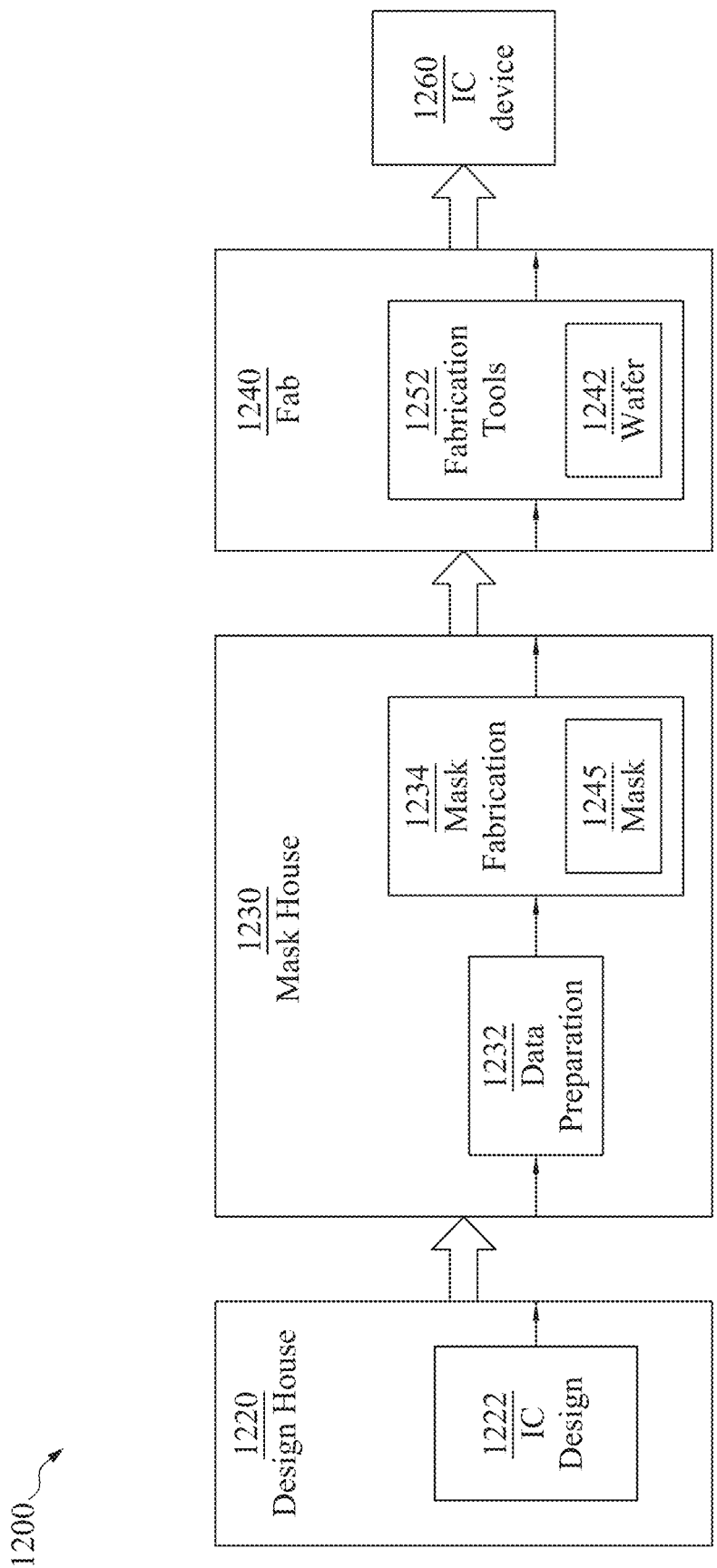
FIG. 12 is a block diagram of an IC manufacturing system, and an IC manufacturing flow associated therewith, in accordance with at least one embodiment of the present disclosure.

In some embodiments, at least one or more operations of method 800 is performed by system 1200 of FIG. 12. In some embodiments, at least one method(s), such as method 800 discussed above, is performed in whole or in part by at least one manufacturing system, including system 1200. One or more of the operations of method 800 is performed by IC fab 1240 (FIG. 12) to fabricate IC device 1260. In some embodiments, one or more of the operations of method 800 is performed by fabrication tools 1252 to fabricate wafer 1242.

In some embodiments, the conductive material includes copper, aluminum, titanium, nickel, tungsten, or other suitable conductive material. In some embodiments, the openings and trench are filled using CVD, PVD, sputtering, ALD or other suitable formation process. In some embodiments, after conductive material is deposited in one or more of operations 804, 806, 808, 810, 812, 814 or 816, the conductive material is planarized to provide a level surface for subsequent steps.

In some embodiments, one or more of the operations of method 800, 900 or 1000 is not performed.

One or more of the operations of methods 900-1000 is performed by a processing device configured to execute instructions for manufacturing an integrated circuit, such as at least integrated circuit 200A-200B, 300A-300B, 400A-400B, 500A-500B, 600A-600B or 700A-700C. In some embodiments, one or more operations of methods 900-1000 is performed using a same processing device as that used in a different one or more operations of methods 900-1000. In some embodiments, a different processing device is used to perform one or more operations of methods 900-1000 from that used to perform a different one or more operations of methods 900-1000. In some embodiments, other order of operations of method 800, 900 or 1000 is within the scope of the present disclosure. Method 800, 900 or 1000 includes exemplary operations, but the operations are not necessarily performed in the order shown. Operations in method 800, 900 or 1000 may be added, replaced, changed order, and/or eliminated as appropriate, in accordance with the spirit and scope of disclosed embodiments.

FIG. 9 is a flowchart of a method 900 of forming or manufacturing an integrated circuit in accordance with some embodiments. It is understood that additional operations may be performed before, during, and/or after the method 900 depicted in FIG. 9, and that some other operations may only be briefly described herein. In some embodiments, the method 900 is usable to form integrated circuits, such as at least integrated circuit 200A-200B, 300A-300B, 400A-400B, 500A-500B, 600A-600B or 700A-700C. In some embodiments, the method 900 is usable to form integrated circuits having similar features and similar structural relationships as one or more of layout design 100A-100B.

In operation 902 of method 900, a layout design of an integrated circuit is generated. Operation 902 is performed by a processing device (e.g., processor 1102 (FIG. 11)) configured to execute instructions for generating a layout design. In some embodiments, the layout design of method 900 includes one or more patterns of at least layout design 100A-100B, or one or more features similar to at least integrated circuit 200A-200B, 300A-300B, 400A-400B, 500A-500B, 600A-600B or 700A-700C. In some embodiments, the layout design of the present application is in a graphic database system (GDSII) file format.

In operation 904 of method 900, the integrated circuit is manufactured based on the layout design. In some embodiments, operation 904 of method 900 comprises manufacturing at least one mask based on the layout design, and manufacturing the integrated circuit based on the at least one mask. In some embodiments, operation 904 is an embodiment of method 900.

In operation 906 of method 900, a portion of the integrated circuit is removed by one or more cut processes.

In some embodiments, operation 906 comprises removing one or more gate portions from the gate by one or more cut-poly (CPO) processes. In some embodiments, the one or more cut-poly (CPO) processes of operation 906 includes removing a portion 350 of gate structure 204*b* thereby forming gate structure 304*b*1 and 304*b*2. In some embodiments, the removed portion 350 of the gate structure 204*b* corresponds to a poly cut region (e.g., poly cut feature pattern).

In some embodiments, the portion 350 of the gate structure 204*b* that is removed in operation 906 is identified in a layout design such as layout design 100A-100B by a poly cut feature pattern. In some embodiments, the poly cut feature pattern identifies a location of the removed portion 350 of the gate structure 204*b* of integrated circuit 300A.

In some embodiments, operation 906 is performed by one or more removal processes. In some embodiments, the one or more removal processes include one or more etching processes suitable to remove a portion of gate structure 204*b*. In some embodiments, the etching process of operation 906 includes identifying a portion 350 of the gate structure 204*b* that is to be removed, and etching the portion 350 of the gate structure 204*b* that is to be removed. In some embodiments, a mask is used to specify portions 350 of the gate structure 204*b* that are to be cut or removed. In some embodiments the mask is a hard mask. In some embodiments, the mask is a soft mask. In some embodiments, etching corresponds to plasma etching, reactive ion etching, chemical etching, dry etching, wet etching, other suitable processes, any combination thereof, or the like. In some embodiments, operation 904 or 906 of method 900 is useable to manufacture one or more integrated circuits having one or more of the advantages described in FIGS. 1A-1B or 2A-7C, and similar detailed description is therefore omitted.

In some embodiments, operation 906 results in the formation of integrated circuit 200A-200B, 300A-300B, 400A-400B, 500A-500B, 600A-600B or 700A-700C. In some embodiments, operation 906 is not performed.

Figure 10:
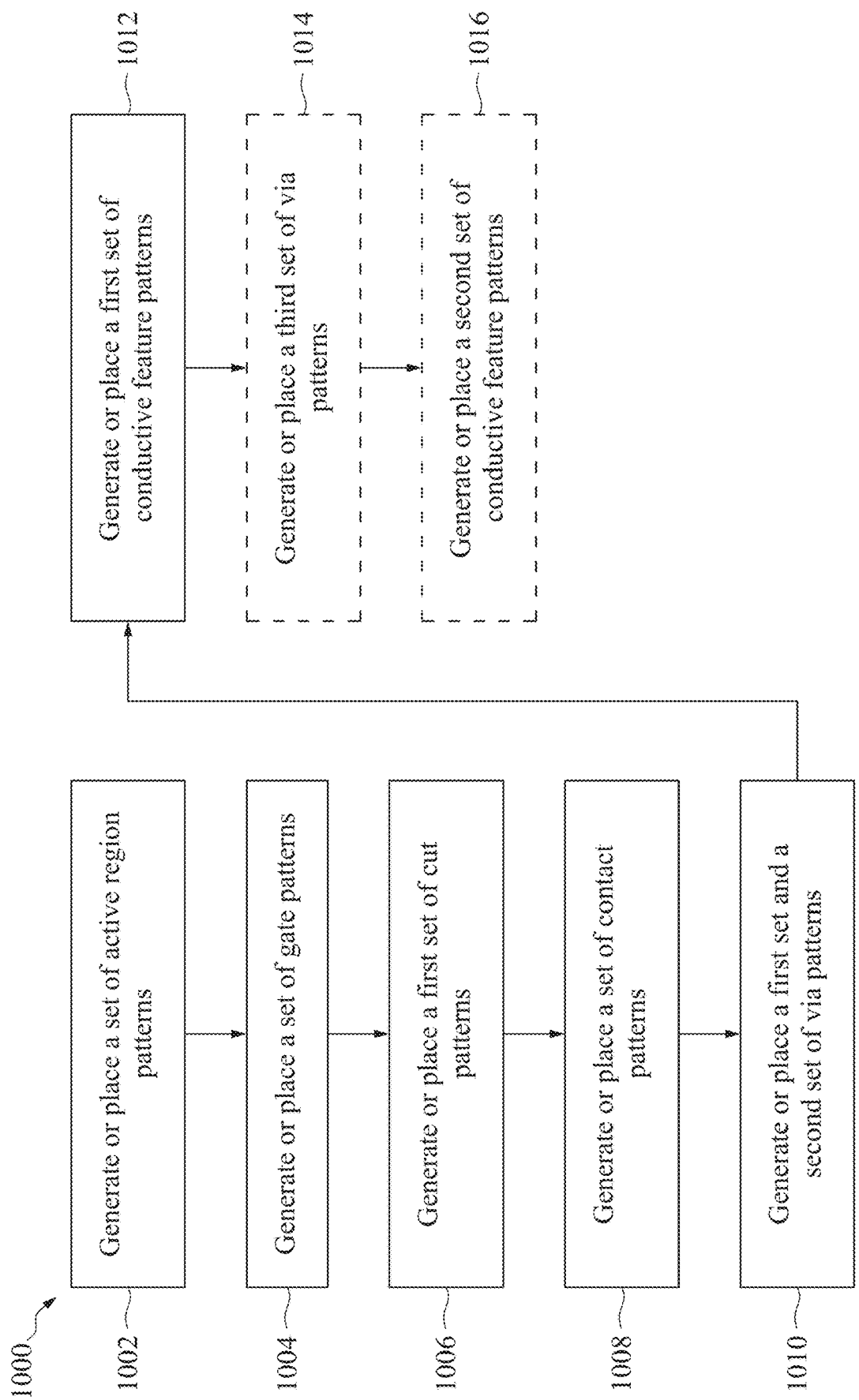
FIG. 10 is a flowchart of a method of generating a layout design of an integrated circuit in accordance with some embodiments.

FIG. 10 is a flowchart of a method 1000 of generating a layout design of an integrated circuit, in accordance with some embodiments. It is understood that additional operations may be performed before, during, and/or after the method 1000 depicted in FIG. 10, and that some other processes may only be briefly described herein. In some embodiments, method 1000 is an embodiment of operation 1002 of method 1000. In some embodiments, method 1000 is usable to generate one or more layout patterns of at least layout design 100A-100B, or one or more features similar to at least integrated circuit 200A-200B, 300A-300B, 400A-400B, 500A-500B, 600A-600B or 700A-700C.

In some embodiments, method 1000 is usable to generate one or more layout patterns having structural relationships including alignment, lengths and widths, as well as configurations and layers of at least layout design 100A-100B, or one or more features similar to at least integrated circuit 200A-200B, 300A-300B, 400A-400B, 500A-500B, 600A-600B or 700A-700C, and similar detailed description will not be described in FIG. 10, for brevity.

In operation 1002 of method 1000, a set of active region patterns is generated or placed on the layout design. In some embodiments, the set of active region patterns of method 1000 includes at least portions of one or more patterns of set of active region patterns 102. In some embodiments, the set of active region patterns of method 1000 includes one or more regions similar to the set of active regions 202.

In operation 1004 of method 1000, a set of gate patterns is generated or placed on the layout design. In some embodiments, the set of gate patterns of method 1000 includes at least portions of one or more gate patterns of set of gate patterns 104. In some embodiments, the set of gate patterns of method 1000 includes one or more gate patterns similar to at least the set of gates 204, 304, 504 or 704.

In operation 1006 of method 1000, a first set of cut patterns is generated or placed on the layout design. In some embodiments, the first set of cut patterns of method 1000 includes at least portions of one or more cut patterns of the set of poly cut feature patterns similar to region 350.

In some embodiments, the first set of cut patterns of method 1000 includes one or more cut patterns similar to at least gate portions 350 of gate structure 304b1 or 304b2 that are removed during operation 906 of method 900 (FIG. 9).

In operation 1008 of method 1000, a set of contact patterns is generated or placed on the layout design. In some embodiments, the set of contact patterns of method 1000 includes at least portions of one or more patterns of at least the set of contact patterns 106. In some embodiments, the set of contact patterns of method 1000 includes one or more contact patterns similar to at least the set of contacts 206, 306, 506 or 706.

In operation 1010 of method 1000, a first set of via patterns and a second set of via patterns are generated or placed on the layout design. In some embodiments, the first set of via patterns of method 1000 includes at least portions of one or more patterns of set of via patterns 110 or 114. In some embodiments, the first set of via patterns of method 1000 includes one or more via patterns similar to at least the set of vias 210, 214, 310, 311, 414, 415, 510, 514, 709, 710 or 711. In some embodiments, the first set of via patterns of method 1000 includes one or more vias similar to at least vias in the VD layer.

In some embodiments, the second set of via patterns of method 1000 includes at least portions of one or more patterns of set of via patterns 112. In some embodiments, the second set of via patterns of method 1000 includes one or more via patterns similar to at least the set of vias 212, 312, 512, 712, 713 or 714. In some embodiments, the second set of via patterns of method 1000 includes one or more vias similar to at least vias in the VG layer.

In operation 1012 of method 1000, a first set of conductive patterns is generated or placed on the layout design. In some embodiments, the first set of conductive patterns of method 1000 includes at least portions of one or more conductive feature patterns of at least the set of conductive feature patterns 120. In some embodiments, the first set of conductive patterns of method 1000 includes one or more conductive feature patterns similar to at least the set of conductors 220, 320, 340, 520, 620 or 720.

In some embodiments, the first set of conductive patterns of method 1000 includes one or more conductors similar to at least conductors in the M0 layer.

In operation 1014 of method 1000, a third set of via patterns is generated or placed on the layout design. In some embodiments, the third set of via patterns of method 1000 includes one or more via patterns similar to at least the set of vias 562. In some embodiments, the third set of via patterns of method 1000 includes one or more vias similar to at least vias in the V0 layer.

In operation 1016 of method 1000, a second set of conductive patterns is generated or placed on the layout design. In some embodiments, the second set of conductive patterns of method 1000 includes one or more conductive feature patterns similar to at least the set of conductors 560. In some embodiments, the second set of conductive patterns of method 1000 includes one or more conductors similar to at least conductors in the M1 layer.

Figure 11:
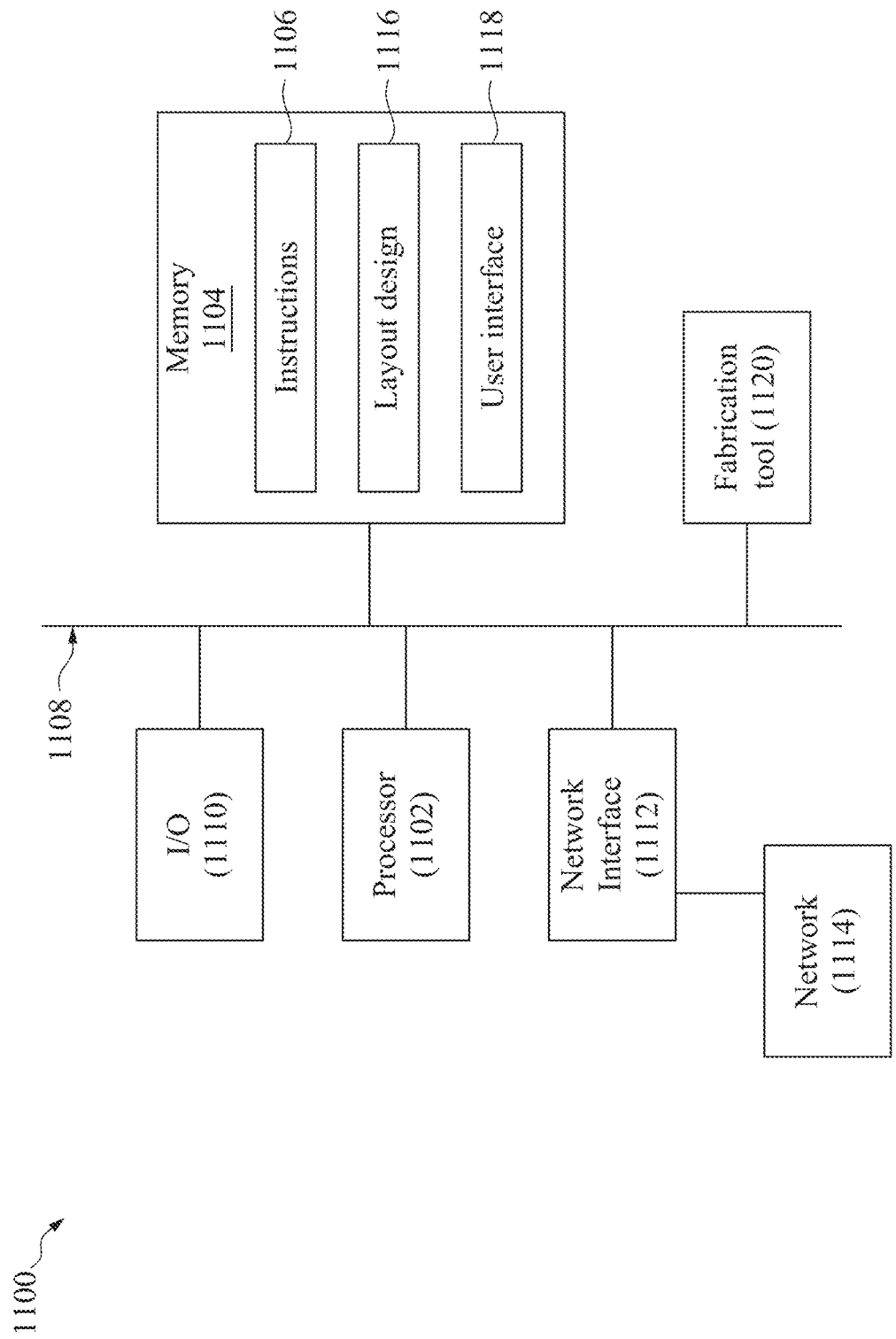
FIG. 11 is a schematic view of a system for designing an IC layout design and manufacturing an IC circuit in accordance with some embodiments.

FIG. 11 is a schematic view of a system 1100 for designing an IC layout design and manufacturing an IC circuit in accordance with some embodiments.

In some embodiments, system 1100 generates or places one or more IC layout designs described herein. System 1100 includes a hardware processor 1102 and a non-transitory, computer readable storage medium 1104 (e.g., memory 1104) encoded with, i.e., storing, the computer program code 1106, i.e., a set of executable instructions 1106. Computer readable storage medium 1104 is configured for interfacing with manufacturing machines for producing the integrated circuit. The processor 1102 is electrically coupled to the computer readable storage medium 1104 via a bus 1108. The processor 1102 is also electrically coupled to an I/O interface 1110 by bus 1108. A network interface 1112 is also electrically connected to the processor 1102 via bus 1108. Network interface 1112 is connected to a network 1114, so that processor 1102 and computer readable storage medium 1104 are capable of connecting to external elements via network 1114. The processor 1102 is configured to execute the computer program code 1106 encoded in the computer readable storage medium 1104 in order to cause system 1100 to be usable for performing a portion or all of the operations as described in method 900-1000.

In some embodiments, the processor 1102 is a central processing unit (CPU), a multi-processor, a distributed processing system, an application specific integrated circuit (ASIC), and/or a suitable processing unit.

In some embodiments, the computer readable storage medium 1104 is an electronic, magnetic, optical, electromagnetic, infrared, and/or a semiconductor system (or apparatus or device). For example, the computer readable storage medium 1104 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1104 includes a compact disk-read only memory (CD-ROM), a compact disk-read/write (CD-R/W), and/or a digital video disc (DVD).

In some embodiments, the storage medium 1104 stores the computer program code 1106 configured to cause system 1100 to perform method 900-1000. In some embodiments, the storage medium 1104 also stores information needed for performing method 900-1000 as well as information generated during performing method 900-1000, such as layout design 1116, user interface 1118 and fabrication tool 1120, and/or a set of executable instructions to perform the operation of method 900-1000. In some embodiments, layout design 1116 comprises one or more of layout patterns of at least layout design 100A-100B, or features similar to at least integrated circuit 200A-200B, 300A-300B, 400A-400B, 500A-500B, 600A-600B or 700A-700C.

In some embodiments, the storage medium 1104 stores instructions (e.g., computer program code 1106) for interfacing with manufacturing machines. The instructions (e.g., computer program code 1106) enable processor 1102 to generate manufacturing instructions readable by the manufacturing machines to effectively implement method 900-1000 during a manufacturing process.

System 1100 includes I/O interface 1110. I/O interface 1110 is coupled to external circuitry. In some embodiments, I/O interface 1110 includes a keyboard, keypad, mouse, trackball, trackpad, and/or cursor direction keys for communicating information and commands to processor 1102.

System 1100 also includes network interface 1112 coupled to the processor 1102. Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interface such as ETHERNET, USB, or IEEE-2094. In some embodiments, method 900-1000 is implemented in two or more systems 1100, and information such as layout design, and user interface are exchanged between different systems 1100 by network 1114.

System 1100 is configured to receive information related to a layout design through I/O interface 1110 or network interface 1112. The information is transferred to processor 1102 by bus 1108 to determine a layout design for producing at least integrated circuit 200A-200B, 300A-300B, 400A-400B, 500A-500B, 600A-600B or 700A-700C. The layout design is then stored in computer readable medium 1104 as layout design 1116. System 1100 is configured to receive information related to a user interface through I/O interface 1110 or network interface 1112. The information is stored in computer readable medium 1104 as user interface 1118. System 1100 is configured to receive information related to a fabrication tool 1120 through I/O interface 1110 or network interface 1112. The information is stored in computer readable medium 1104 as fabrication tool 1120. In some embodiments, the fabrication tool 1120 includes fabrication information utilized by system 1100. In some embodiments, the fabrication tool 1120 corresponds to mask fabrication 1234 of FIG. 12.

In some embodiments, method 900-1000 is implemented as a standalone software application for execution by a processor. In some embodiments, method 900-1000 is implemented as a software application that is a part of an additional software application. In some embodiments, method 900-1000 is implemented as a plug-in to a software application. In some embodiments, method 900-1000 is implemented as a software application that is a portion of an EDA tool. In some embodiments, method 900-1000 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 900-1000 is implemented by a manufacturing device to manufacture an integrated circuit using a set of masks manufactured based on one or more layout designs generated by system 1100. In some embodiments, system 1100 is a manufacturing device configured to manufacture an integrated circuit using a set of masks manufactured based on one or more layout designs of the present disclosure. In some embodiments, system 1100 of FIG. 11 generates layout designs of an integrated circuit that are smaller than other approaches. In some embodiments, system 1100 of FIG. 11 generates layout designs of integrated circuit structure that occupy less area and provide better routing resources than other approaches.

FIG. 12 is a block diagram of an integrated circuit (IC) manufacturing system 1200, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 1200.

In FIG. 12, IC manufacturing system 1200 (hereinafter "system 1200") includes entities, such as a design house 1220, a mask house 1230, and an IC manufacturer/fabricator ("fab") 1240, that interact with one another in the design, development, and manufacturing cycles and/or services related to manufacturing an IC device 1260. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 1220, mask house 1230, and IC fab 1240 is owned by a single larger company. In some embodiments, one or more of design house 1220, mask house 1230, and IC fab 1240 coexist in a common facility and use common resources.

Design house (or design team) 1220 generates an IC design layout 1222. IC design layout 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout 1222 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout 1222. The design procedure includes one or more of logic design, physical design or place and route. IC design layout 1222 is presented in one or more data files having information of the geometrical patterns. For example, IC design layout 1222 can be expressed in a GDSII file format or DFII file format.

Mask house 1230 includes data preparation 1232 and mask fabrication 1234. Mask house 1230 uses IC design layout 1222 to manufacture one or more masks 1245 to be used for fabricating the various layers of IC device 1260 according to IC design layout 1222. Mask house 1230 performs mask data preparation 1232, where IC design layout 1222 is translated into a representative data file (RDF). Mask data preparation 1232 provides the RDF to mask fabrication 1234. Mask fabrication 1234 includes a mask writer. A mask writer converts the RDF to an image on a substrate, such as a mask (reticle) 1245 or a semiconductor wafer 1242. The design layout 1222 is manipulated by mask data preparation 1232 to comply with particular characteristics of the mask writer and/or requirements of IC fab 1240. In FIG. 12, mask data preparation 1232 and mask fabrication 1234 are illustrated as separate elements. In some embodiments, mask data preparation 1232 and mask fabrication 1234 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1234, which may undo part of the modifications performed by OPC in order to meet mask creation rules.

In some embodiments, mask data preparation 1232 includes lithography process checking (LPC) that simulates processing that will be implemented by IC fab 1240 to fabricate IC device 1260. LPC simulates this processing based on IC design layout 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1222.

It should be understood that the above description of mask data preparation 1232 has been simplified for the purposes of clarity. In some embodiments, data preparation 1232 includes additional features such as a logic operation (LOP) to modify the IC design layout according to manufacturing rules. Additionally, the processes applied to IC design layout 1222 during data preparation 1232 may be executed in a variety of different orders.

After mask data preparation 1232 and during mask fabrication 1234, a mask 1245 or a group of masks 1245 are fabricated based on the modified IC design layout 1222. In some embodiments, mask fabrication 1234 includes performing one or more lithographic exposures based on IC design 1222. In some embodiments, an electron-beam (e-beam) or a mechanism of multiple e-beams is used to form a pattern on a mask (photomask or reticle) 1245 based on the modified IC design layout 1222. The mask 1245 can be formed in various technologies. In some embodiments, the mask 1245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 1245 includes a transparent substrate (e.g., fused quartz) and an opaque material (e.g., chromium) coated in the opaque regions of the binary mask. In another example, the mask 1245 is formed using a phase shift technology. In the phase shift mask (PSM) version of mask 1245, various features in the pattern formed on the mask are configured to have proper phase difference to enhance the resolution and imaging quality. In various examples, the phase shift mask can be attenuated PSM or alternating PSM. The mask(s) generated by mask fabrication 1234 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1240 is an IC fabrication entity that includes one or more manufacturing facilities for the fabrication of a variety of different IC products. In some embodiments, IC Fab 1240 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1240 includes wafer fabrication tools 1252 (hereinafter "fabrication tools 1252") configured to execute various manufacturing operations on semiconductor wafer 1242 such that IC device 1260 is fabricated in accordance with the mask(s), e.g., mask 1245. In various embodiments, fabrication tools 1252 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1240 uses mask(s) 1245 fabricated by mask house 1230 to fabricate IC device 1260. Thus, IC fab 1240 at least indirectly uses IC design layout 1222 to fabricate IC device 1260. In some embodiments, a semiconductor wafer 1242 is fabricated by IC fab 1240 using mask(s) 1245 to form IC device 1260. In some embodiments, the IC fabrication includes performing one or more lithographic exposures based at least indirectly on IC design 1222. Semiconductor wafer 1242 includes a silicon substrate or other proper substrate having material layers formed thereon. Semiconductor wafer 1242 further includes one or more of various doped regions, dielectric features, multilevel interconnects, and the like (formed at subsequent manufacturing steps).

System 1200 is shown as having design house 1220, mask house 1230 or IC fab 1240 as separate components or entities. However, it is understood that one or more of design house 1220, mask house 1230 or IC fab 1240 are part of the same component or entity.

One aspect of this description relates to an integrated circuit. In some embodiments, the integrated circuit includes a set of active regions, a first contact, a set of gates, a first conductive line, a second conductive line, a first via and a second via. In some embodiments, the set of active regions extending in a first direction, and being on a first level of a substrate. In some embodiments, the first contact extending in a second direction different from the first direction, being on a second level different from the first level, and overlapping at least a first active region of the set of active regions. In some embodiments, the set of gates extending in the second direction, overlapping the set of active regions, and being on a third level different from the first level. In some embodiments, the first conductive line extending in the first direction, and overlapping the first contact, and being on a fourth level different from the first level, the second level and the third level. In some embodiments, the second conductive line extending in the first direction, being on the fourth level, overlapping the first contact, and being separated from the first conductive line in the second direction. In some embodiments, the first via between the first contact and the first conductive line, the first via electrically coupling the first contact and the first conductive line together. In some embodiments, the second via between the first contact and the second conductive line, the second via electrically coupling the first contact and the second conductive line together.

Another aspect of this description relates to an integrated circuit. In some embodiments, the integrated circuit includes a set of active regions, a first contact, a set of gates, a first conductive line, a second conductive line, and a first slot via. In some embodiments, the set of active regions extending in a first direction, and being on a first level of a substrate. In some embodiments, the first contact extending in a second direction different from the first direction, being on a second level different from the first level, and overlapping at least a first active region of the set of active regions. In some embodiments, the set of gates extending in the second direction, overlapping the set of active regions, and being on a third level different from the first level. In some embodiments, the first conductive line extending in the first direction, and overlapping the first contact, and being on a fourth level different from the first level, the second level and the third level. In some embodiments, the second conductive line extending in the first direction, being on the fourth level, overlapping the first contact, and being adjacent to the first conductive line. In some embodiments, the first slot via between the first contact and each of the first conductive line and the second conductive line, the first slot via extending from at least the first conductive line to at least the second conductive line, the first slot via electrically coupling the first contact, the first conductive line and the second conductive line together.

Still another aspect of this description relates to a method of fabricating an integrated circuit. In some embodiments, the method includes fabricating a set of active regions of a set of transistors in a front-side of a substrate, the set of active regions extending in a first direction. In some embodiments, the method further includes depositing a first conductive material over the set of active regions on a first level thereby forming a set of contacts, the set of contacts including a first contact, the first contact extending in a second direction different from the first direction, and overlapping at least a first active region of the set of active regions. In some embodiments, the method further includes fabricating a set of gates over the set of active regions on a second level, the set of gates extending in the second direction, the set of gates overlapping the set of active regions, and being between the set of contacts. In some embodiments, the method further includes fabricating a first set of vias over the first contact, the first set of vias including a first via and a second via. In some embodiments, the method further includes depositing a second conductive material over at least the set of contacts on a third level thereby forming a first set of signal lines, the third level being above the first level and the second level, the first set of signal lines including a first conductive line and a second conductive line extending in the first direction, and overlapping the first contact. In some embodiments, the first via is between the first contact and the first conductive line, and the first via electrically couples the first contact and the first conductive line together. In some embodiments, the second via is between the first contact and the second conductive line, and the second via electrically couples the first contact and the second conductive line together.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a set of active regions extending in a first direction, and being on a first level of a substrate;
   a first contact extending in a second direction different from the first direction, being on a second level different from the first level, and overlapping at least a first active region of the set of active regions;
   a set of gates extending in the second direction, overlapping the set of active regions, and being on a third level different from the first level;
   a first conductive line extending in the first direction, and overlapping the first contact, and being on a fourth level different from the first level, the second level and the third level;

a second conductive line extending in the first direction, being on the fourth level, overlapping the first contact, and being separated from the first conductive line in the second direction;
a first via between the first contact and the first conductive line, the first via electrically coupling the first contact and the first conductive line together; and
a second via between the first contact and the second conductive line, the second via electrically coupling the first contact and the second conductive line together.

2. The integrated circuit of claim 1, wherein the set of gates comprises:
a first gate extending in the second direction, overlapping the set of active regions, and being on the third level.

3. The integrated circuit of claim 2, further comprising:
a third via between the first gate and the first conductive line, the third via electrically coupling the first gate and the first conductive line together.

4. The integrated circuit of claim 3 wherein
the first gate is a gate of a first transistor;
the first contact is electrically coupled to a source or a drain of the first transistor; and
the first transistor is configured as a diode coupled transistor.

5. The integrated circuit of claim 3, further comprising:
a second contact extending in the second direction, being on the second level, overlapping at least the first active region of the set of active regions, and being separated from the first contact in the first direction; and
a fourth via between the second contact and the second conductive line, the fourth via electrically coupling the second contact and the second conductive line together,
wherein the first via, the second via and the fourth via are arranged in an L-shape.

6. The integrated circuit of claim 5, further comprising:
a third contact extending in the second direction, being on the second level, overlapping at least the first active region of the set of active regions, and being separated from the first contact and the second contact in the first direction, the second contact being between the first contact and the third contact; and
a fifth via between the third contact and the second conductive line, the fifth via electrically coupling the third contact and the second conductive line together,
wherein the first via, the second via, the fourth via and the fifth via are arranged in a T-shape.

7. The integrated circuit of claim 3, wherein the set of gates further comprises:
a second gate extending in the second direction, overlapping the set of active regions, being on the third level, and being separated from the first gate in the first direction;
a third gate extending in the second direction, overlapping the set of active regions, being on the third level, and being separated from the first gate and the second gate in the first direction;
a fourth gate extending in the second direction, overlapping the set of active regions, being on the third level, and being separated from the first gate, the second gate and the third gate in the first direction; and
a fifth gate extending in the second direction, overlapping the set of active regions, being on the third level, and being separated from the first gate, the second gate, the third gate and the fourth gate in the first direction.

8. The integrated circuit of claim 7, further comprising:
a fourth via between the second gate and the second conductive line, the fourth via electrically coupling the second gate and the second conductive line together;
a fifth via between the third gate and the second conductive line, the fifth via electrically coupling the third gate and the second conductive line together;
a sixth via between the fourth gate and the second conductive line, the sixth via electrically coupling the fourth gate and the second conductive line together; and
a seventh via between the fifth gate and the second conductive line, the seventh via electrically coupling the fifth gate and the second conductive line together.

9. The integrated circuit of claim 1, further comprising:
a third conductive line extending in the first direction, overlapping the first contact, being on the fourth level, and being separated from the first conductive line and the second conductive line in the second direction; and
a fourth conductive line extending in the first direction, overlapping the first contact, being on the fourth level, and being separated from the first conductive line and the second conductive line in the second direction;
wherein the third conductive line and the fourth conductive line are between the first conductive line and the second conductive line.

10. The integrated circuit of claim 1, wherein the first conductive line and the second conductive line are adjacent to each other.

11. An integrated circuit comprising:
a set of active regions extending in a first direction, and being on a first level of a substrate;
a first contact extending in a second direction different from the first direction, being on a second level different from the first level, and overlapping at least a first active region of the set of active regions;
a set of gates extending in the second direction, overlapping the set of active regions, and being on a third level different from the first level;
a first conductive line extending in the first direction, and overlapping the first contact, and being on a fourth level different from the first level, the second level and the third level;
a second conductive line extending in the first direction, being on the fourth level, overlapping the first contact, and being adjacent to the first conductive line; and
a first slot via between the first contact and each of the first conductive line and the second conductive line, the first slot via extending from at least the first conductive line to at least the second conductive line, the first slot via electrically coupling the first contact, the first conductive line and the second conductive line together.

12. The integrated circuit of claim 11, wherein the set of gates comprises:
a first gate extending in the second direction, overlapping the set of active regions, and being on the third level.

13. The integrated circuit of claim 12, further comprising:
a first via between the first gate and the first conductive line, the first via electrically coupling the first gate and the first conductive line together.

14. The integrated circuit of claim 13 wherein
the first gate is a gate of a first transistor;
the first contact is electrically coupled to a source or a drain of the first transistor; and
the first transistor is configured as a diode coupled transistor.

15. The integrated circuit of claim 13, further comprising:
a second contact extending in the second direction, being on the second level, overlapping at least the first active region of the set of active regions, and being separated from the first contact in the first direction; and
a second via between the second contact and the second conductive line, the second via electrically coupling the second contact and the second conductive line together.

16. The integrated circuit of claim 15, further comprising:
a third via; and
the set of gates further comprises:
    a second gate extending in the second direction, overlapping the set of active regions, being on the third level, and being separated from the first gate in the first direction,
wherein the third via is between the second gate and the second conductive line, and the third via electrically couples the second gate and the second conductive line together.

17. The integrated circuit of claim 16, wherein the set of gates further comprises:
a third gate extending in the second direction, overlapping the set of active regions, being on the third level, and being separated from the first gate and the second gate in the first direction;
a fourth gate extending in the second direction, overlapping the set of active regions, being on the third level, and being separated from the first gate, the second gate and the third gate in the first direction; and
a fifth gate extending in the second direction, overlapping the set of active regions, being on the third level, and being separated from the first gate, the second gate, the third gate and the fourth gate in the first direction.

18. The integrated circuit of claim 17, further comprising:
a fourth via between the third gate and the second conductive line, the fourth via electrically coupling the third gate and the second conductive line together;
a fifth via between the fourth gate and the second conductive line, the fifth via electrically coupling the fourth gate and the second conductive line together; and
a sixth via between the fifth gate and the second conductive line, the sixth via electrically coupling the fifth gate and the second conductive line together.

19. The integrated circuit of claim 11, further comprising:
a first power rail extending in the first direction, configured to supply a first supply voltage or a second supply voltage, and being on the fourth level; and
a second power rail extending in the first direction, configured to supply the first supply voltage or the second supply voltage, and being on the fourth level, and being separated from the first power rail in the second direction.

20. A method of fabricating an integrated circuit, the method comprising:
fabricating a set of active regions of a set of transistors in a front-side of a substrate, the set of active regions extending in a first direction;
depositing a first conductive material over the set of active regions on a first level thereby forming a set of contacts, the set of contacts including a first contact, the first contact extending in a second direction different from the first direction, and overlapping at least a first active region of the set of active regions;
fabricating a set of gates over the set of active regions on a second level, the set of gates extending in the second direction, the set of gates overlapping the set of active regions, and being between the set of contacts;
fabricating a first set of vias over the first contact, the first set of vias including a first via and a second via; and
depositing a second conductive material over at least the set of contacts on a third level thereby forming a first set of signal lines, the third level being above the first level and the second level, the first set of signal lines including a first conductive line and a second conductive line extending in the first direction, and overlapping the first contact;
wherein the first via is between the first contact and the first conductive line, and the first via electrically couples the first contact and the first conductive line together; and
the second via is between the first contact and the second conductive line, and the second via electrically couples the first contact and the second conductive line together.

* * * * *